(12) United States Patent
Banerjee et al.

(10) Patent No.: US 9,978,924 B2
(45) Date of Patent: *May 22, 2018

(54) METHOD OF PRODUCING THERMOELECTRIC MATERIAL

(75) Inventors: Debasish Banerjee, Ann Arbor, MI (US); Minjuan Zhang, Ann Arbor, MI (US); Takuji Kita, Susono (JP)

(73) Assignee: Toyota Jidosha Kabushiki Kaisha, Toyota-shi (JP)

(*) Notice: Subject to any disclaimer, the term of this patent is extended or adjusted under 35 U.S.C. 154(b) by 546 days.

This patent is subject to a terminal disclaimer.

(21) Appl. No.: 13/166,860

(22) Filed: Jun. 23, 2011

(65) Prior Publication Data

US 2012/0326075 A1 Dec. 27, 2012

Related U.S. Application Data

(63) Continuation-in-part of application No. 13/122,575, filed as application No. PCT/IB2009/007244 on Oct. 9, 2009.

(51) Int. Cl.
*H01L 35/12* (2006.01)
*H01L 35/26* (2006.01)
(Continued)

(52) U.S. Cl.
CPC ............ *H01L 35/26* (2013.01); *C01B 19/007* (2013.01); *H01L 35/14* (2013.01); *H01L 35/22* (2013.01); *H01L 35/34* (2013.01)

(58) Field of Classification Search
CPC ......... H01L 35/16; H01L 35/22; H01L 36/26; H01L 36/34; C01B 19/007
(Continued)

(56) References Cited

U.S. PATENT DOCUMENTS 5,690,807 A * 11/1997 Clark et al. .................. 205/655
5,922,988 A 7/1999 Nishimoto
(Continued)

FOREIGN PATENT DOCUMENTS

EP 1959508 A1 8/2008
EP 2039448 A1 3/2009
(Continued)

OTHER PUBLICATIONS

C. Stiewe et al., Nanostructured Co1-xNix(Sb1-yTey)3 skutterudites: Theoretical modeling, synthesis and thermoelectric properties, Journal of Applied Physics, Jan. 28, 2005, pp. 044317-1-044317-7, vol. 97.
(Continued)

*Primary Examiner* — Thanh Truc Trinh
(74) *Attorney, Agent, or Firm* — Dinsmore & Shohl LLP

(57) ABSTRACT

A process for manufacturing a nanocomposite thermoelectric material having a plurality of nanoparticle inclusions. The process includes determining a material composition to be investigated for the nanocomposite thermoelectric material, the material composition including a conductive bulk material and a nanoparticle material. In addition, a range of surface roughness values for the insulating nanoparticle material that can be obtained using current state of the art manufacturing techniques is determined. Thereafter, a plurality of Seebeck coefficients, electrical resistivity values, thermal conductivity values and figure of merit values as a function of the range of nanoparticle material surface roughness values is calculated. Based on these calculated values, a nanocomposite thermoelectric material composition or ranges of compositions is/are selected and manufactured.

4 Claims, 20 Drawing Sheets

(51) Int. Cl.
*H01L 35/22* (2006.01)
*C01B 19/00* (2006.01)
*H01L 35/14* (2006.01)
*H01L 35/34* (2006.01)

(58) Field of Classification Search
USPC ............ 136/200–242; 252/71, 500; 264/104; 977/779
See application file for complete search history.

(56) References Cited

U.S. PATENT DOCUMENTS

| | | | |
|---|---|---|---|
| 6,858,154 B2 | 2/2005 | Suzuki et al. | |
| 7,465,871 B2 | 12/2008 | Chen et al. | |
| 7,734,428 B2 * | 6/2010 | Banerjee et al. | ............ 702/30 |
| 8,044,292 B2 | 10/2011 | Xiao et al. | |
| 8,394,284 B2 | 3/2013 | Murai et al. | |
| 2001/0002275 A1 * | 5/2001 | Oldenburg et al. | ........... 427/214 |
| 2005/0268956 A1 | 12/2005 | Take | |
| 2006/0102224 A1 | 5/2006 | Chen et al. | |
| 2006/0118158 A1 | 6/2006 | Zhang et al. | |
| 2008/0230763 A1 * | 9/2008 | Zaidi et al. | ........................ 257/9 |
| 2009/0105988 A1 | 4/2009 | Banerjee et al. | |
| 2009/0314324 A1 | 12/2009 | Murai et al. | |
| 2011/0198541 A1 | 8/2011 | Murai et al. | |

FOREIGN PATENT DOCUMENTS

| | | | |
|---|---|---|---|
| JP | 1032355 A | 2/1998 | |
| JP | 11-298052 A | 10/1999 | |
| JP | 2000-252526 A | 9/2000 | |
| JP | 2000-261047 A | 9/2000 | |
| JP | 2001-076452 A | 3/2001 | |
| JP | 2002-026404 A | 1/2002 | |
| JP | 3559962 B2 | 9/2004 | |
| JP | 2007021670 A | 2/2007 | |
| JP | 3925932 B2 | 6/2007 | |
| JP | 2008006513 A | 1/2008 | |
| JP | 2008-147625 A | 6/2008 | |
| JP | 2008-523579 A | 7/2008 | |
| JP | 2008-305919 A | 12/2008 | |
| JP | 2009-147145 A | 7/2009 | |
| JP | 2010114419 A | 5/2010 | |
| JP | 2011517109 A | 5/2011 | |
| WO | 2006137923 A2 | 12/2006 | |
| WO | 2007066820 A1 | 6/2007 | |
| WO | 2009125317 A2 | 10/2009 | |
| WO | WO 2010/041146 | * 4/2010 | ............ H01L 35/16 |

OTHER PUBLICATIONS

F.F. Fang et al., Negative Field-Effect Mobility on (100) Si Surfaces, Physical Review Letters, May 2, 1966, pp. 797-799, vol. 16, No. 18.

S.M. Goodnick et al., Surface roughness at the Si(100)-SiO2 interface, Physical Review B, Dec. 15, 1985, pp. 8171-8186, vol. 32, No. 12.

B.K. Ridley et al., Mobility of electrons in bulk GaN and AlxGal-xN/GaN heterostructures, Physical Review B, Jun. 15, 2000, pp. 16 862-16 869, vol. 61, No. 24.

D Zanato et al., The effect of interface-roughness and dislocation scattering on low temperature mobility of 2D electron gas in GaN/AlGaN, Semiconductor Science and Technology, Jan. 13, 2004, pp. 427-432, vol. 19.

M. Babiker et al, Scattering of electrons by the quantised bulk plasma modes in electronically dense materials, IOPscience, J. Phys. C: Solid State Phys. 19, (1986) pp. 161-172.

B.K. Ridley, Electrons and Phonons in Semiconductor Multilayers, Cambridge Studies in Semiconductor Physics and Microelectronic Engineering 5, Cambridge University Press, (1997) p. 235.

R. Gupta et al, Elastic scattering of phonons and interface polaritons in semiconductor heterostructures, Physical Review B, Oct. 15, 1993, pp. 11 972-11 978, vol. 48, No. 16.

B-L Huang et al, Ab initio and molecular dynamics predictions for electron and phonon transport in bismuth telluride, Physical Review B, (Mar. 12, 2008), pp. 125209-1 to 125209-19.

Li et al., A model for scattering due to interface roughness in finite quantum wells, Nov. 15, 2005, pp. 1207-1212.

* cited by examiner

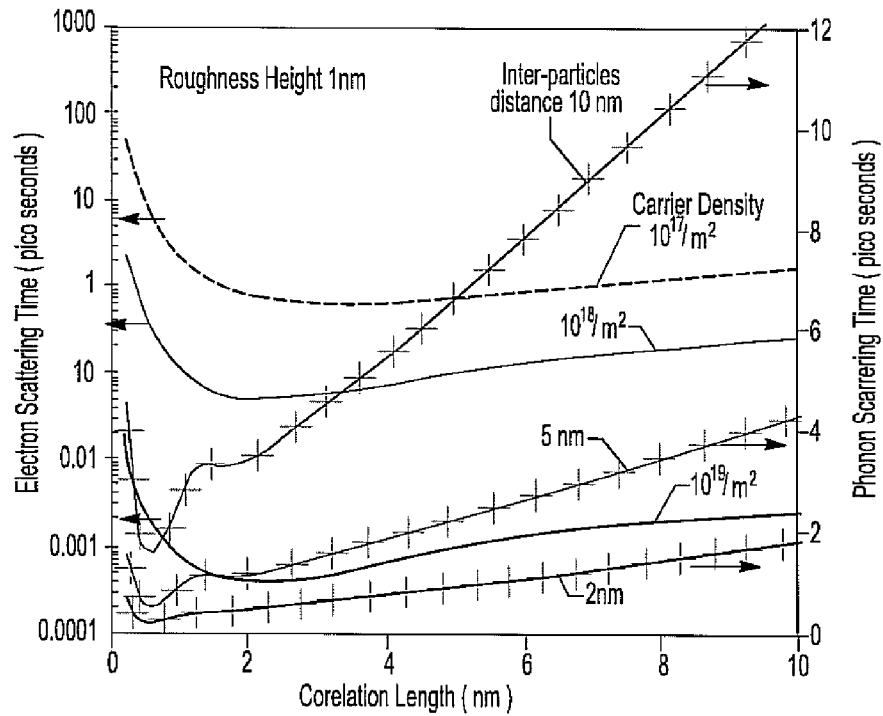
*Fig-6*
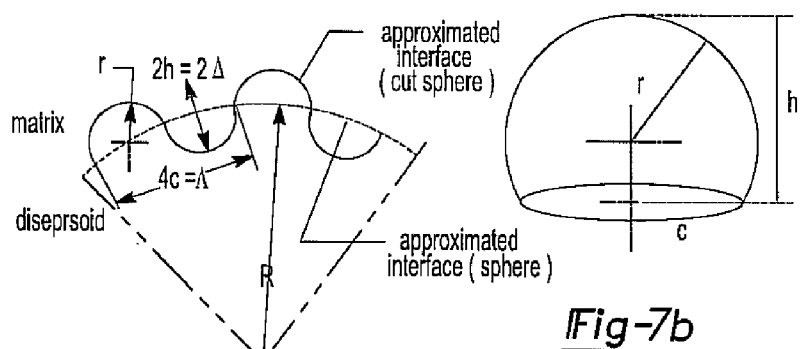
*Fig-7a*   *Fig-7b*

INTERFACE ROUGHNESS = 1.0 ± 0.21

INTERFACE ROUGHNESS = 1.5 ± 0.22

METHOD OF PRODUCING THERMOELECTRIC MATERIAL

RELATED APPLICATION

This application is a continuation-in-part of U.S. patent application Ser. No. 13/122,575, filed on Apr. 5, 2011, which is the national stage of international application of PCT Application No. PCT/IB2009/007244 filed on Oct. 9, 2009.

FIELD OF THE INVENTION

This invention relates to materials having thermoelectric properties and to thermoelectric devices.

BACKGROUND OF THE INVENTION

A thermoelectric device can be used to obtain electrical energy from a thermal gradient (for example, a thermoelectric generator using the Seebeck effect), or to generate a thermal gradient from electrical energy (for example, a thermoelectric refrigerator using the Peltier effect). The discussion below is directed to the Seebeck effect, but the general concepts also apply to applications of the Peltier effect.

A typical thermoelectric device is built up from several unicouples, which are typically pairs of thermally conductive p-type (P) and n-type (N) semiconductors. These unicouples are connected electrically in series and thermally in parallel. Theoretically, the maximum efficiency of the conversion of heat energy to electrical energy is given by:

$$\zeta_{max} = \frac{(T_H - T_C)}{T_H} \frac{\sqrt{1 + ZT_{ave}} - 1}{\sqrt{1 + ZT_{ave}} + T_C/T_H}$$

where $T_{ave}=(T_H+T_C)/2$ is the average temperature of thermal gradient having a hot temperature ($T_H$) end and a cold temperature ($T_C$) end, and Z is a figure of merit, defined as $Z=S^2\sigma/\kappa$. The figure of merit Z depends on the macroscopic transport parameters of the materials, namely the Seebeck coefficient (S), electrical conductivity ($\sigma$), and thermal conductivity ($\kappa$). A large figure of merit is provided by a thermoelectric material having a large Seebeck coefficient, high electrical conductivity, and low thermal conductivity.

The Seebeck coefficient is further defined as the ratio of the open-circuit voltage to the temperature difference between the hot and cold junctions of a circuit exhibiting the Seebeck effect, or $S=V/(T_H-T_C)$. Since Z varies with temperature, a useful dimensionless figure of merit can be defined as ZT.

By the end of the 1950s, the best bulk thermoelectric materials were found to be alloys of bismuth telluride and antimony, which gave a room temperature ZT~1. Workers in the thermoelectric field have been attempting to improve the figure of merit over the past 40 years without much success. Increasing ZT is difficult because the three parameters S, $\sigma$, and k are all related to the free carrier concentration and are usually not independent. For example, doping typically increases the semiconductor's electrical conductivity, but decreases its Seebeck coefficient and increases the thermal conductivity. Efforts to reduce the lattice thermal conductivity by alloying also reduce the electrical conductivity by providing an extra scattering mechanism.

Dresselhaus and coworkers at MIT theoretically demonstrated that quantum confinement of electrons and phonons within nanowires of a thermoelectric material can increase the value of ZT. 1-D nanowires in particular could reach ZT≈2-5 if the nanowire diameter lies in the range of 5-10 nanometers. Certain structures have been investigated, for example such as described in Heremans, J. P. et al., "Thermoelectric Power of Bismuth Nanocomposites"; Phys. Rev. Lett.; 2002, 88, 216801; Venkatasubramanian, R. et al., "Thin-film thermoelectric devices with high room temperature figures of merit"; Nature; 2001, 413, 597-602; Harman, T. C. et al., "Thermoelectric quantum dot superlattices with high ZT"; Electron. Mater; 2000, 29, L1-L4; Rabin, O. et al., "Anomalously high thermoelectric figure of merit in $Bi_{1-x}Sb_x$ nanowires by carrier pocket alignment"; APL; 2001, 79, 81-83; and Dresselhaus, M. S. et al., "Low-dimensional thermoelectric materials"; PSS; 1999, 41, 679-682. However, these approaches do not provide a simple approach to making large-scale, low-cost thermoelectric devices. Conventional semiconductor device fabrication methods are unsuitable for manufacturing bulk samples, and are often expensive.

In automobiles, about 70 percent of energy derived from fuel is lost to waste heat and engine cooling. Only a small proportion of energy provided by fuel combustion is used, and a large amount of thermal energy is thrown away. Recovery of waste thermal energy is a big challenge in automotive industries due to the increasing energy crisis. Thermoelectric conversion of thermal energy to electrical energy could be an effective way to obtain electrical energy from otherwise wasted heat production. However, direct thermal to electric conversion (DTEC) technology currently faces two major challenges: low conversion efficiency and insufficient power density. Hence, improved materials and devices having high thermoelectric conversion efficiency are urgently required.

In response to the need for high thermoelectric conversion efficiency materials, Zhang et al. have investigated thermoelectric materials comprising two or more components, at least one of which is a thermoelectric material (U.S. Pat. No. 7,309,830). However, a given thermoelectric material system can have a wide range of compositions that may, or may not, exhibit high ZT values, and as such, Banerjee et at have developed a process for determining an optimum range of compositions for a nanocomposite thermoelectric material system (U.S. Pat. No. 7,734,428).

In addition to the above, other factors such as second phase particle surface properties, e.g. surface roughness, may affect the properties of thermoelectric materials. However, as of yet no process has been developed to determine if there is and/or which optimum range of such factors can provide a nanocomposite thermoelectric material with an improved ZT. Therefore, a process to model, calculate and/or determine an optimum range of second phase surface properties in which a nanocomposite thermoelectric material exhibits high ZT values would be desirable.

SUMMARY OF THE INVENTION

A process for manufacturing a nanocomposite thermoelectric material having a plurality of nanoparticle inclusions is provided. The process includes determining a material composition to be investigated for the nanocomposite thermoelectric material, the material composition including a conductive bulk material and an insulating nanoparticle inclusion material. In addition, a range of surface roughness values for the insulating nanoparticle material that can be obtained using current state of the art manufacturing techniques is determined. Thereafter, a plurality of Seebeck coefficients for the material composition as a function of the range of nanoparticle material surface roughness values is calculated, as is a plurality of electrical resistivity values and a plurality of thermal conductivity values.

Once the plurality of Seebeck coefficients, electrical resistivity values, and thermal conductivity values have been calculated, a corresponding range of figure of merit values for the material composition is calculated and a generally maximum range of the figure of merit values for the material composition and as a function of the range of nanoparticle material surface roughness values is determined. Thereafter, a thermoelectric material having the determined material composition and nanoparticle material surface roughness corresponding to the generally maximum range of figure of merit values is manufactured.

The range of nanoparticle material surface roughness values can include a range of interfacial densities between 0.1 and 1.0 nanometers$^{-1}$. The range of nanoparticle material surface roughness values can also have a range of roughness correlation lengths between 0.1 to 10 nanometers and a range of roughness heights between 0.1 and 8 nanometers.

The nanoparticle material surface roughness corresponding to the surface roughness values can be obtained by etching the insulating nanoparticles and/or by in-situ nanoparticle growth. In some instances, the nanoparticles are obtained by producing a plurality of insulating nanowires and breaking the nanowires into nanoparticles, which are then subjected to an surface roughening process. In the alternative, a plurality of nanowires with a desired surface roughness can be provided before being broken into nanoparticles having at least one surface with a desired nanoparticle material surface roughness value. The nanowires can posses the desired surface roughness via an etching process, the surface roughness having a range of interfacial densities between 0.1 and 1.0 nanometers$^{-1}$, a range of roughness correlation lengths between 0.1 to 10 nanometers, and/or a range of roughness heights between 0.1 and 8 nanometers.

It is appreciated that the insulating nanoparticles can be incorporated within the conductive bulk material using any process, technique, etc. known to those skilled in the art such that a nanocomposite thermoelectric material is provided.

In some instances, the figure of merit values for the material system are calculated using the expression:

$$ZT = S^2 T/k\rho$$

Wherein ZT is the dimensionless figure of merit, S is the Seebeck coefficient, T is temperature in Kelvin, k is the thermal conductivity and $\rho$ is the electrical resistivity for a given material composition.

BRIEF DESCRIPTION OF THE FIGURES

FIG. 6 is a graphical representation of electron and phonon scattering time as a function of roughness correlation length and carrier concentration;

FIG. 7 is a schematic illustration of a model incorporating surface roughness into interfacial density for a nanoparticle according to an embodiment of the present invention;

DETAILED DESCRIPTION OF THE INVENTION

Figure 1A:
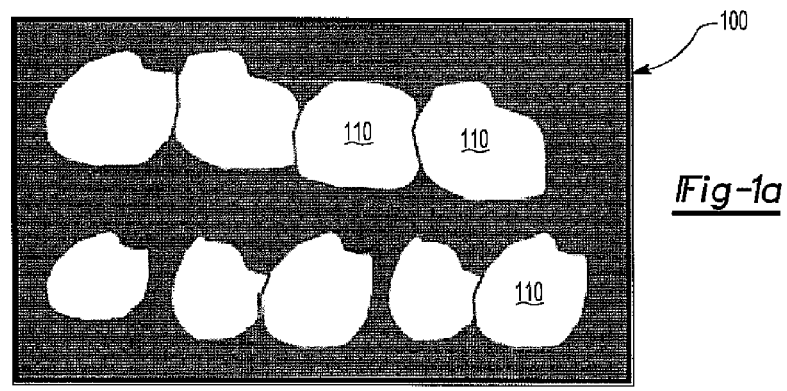
FIG. 1 is a schematic illustration of a nanocomposite thermoelectric material having a plurality of insulating nanoparticle inclusions with a rough surface.

The present invention discloses a process for determining an optimum range of compositions for a thermoelectric material system, within which the material system may exhibit generally high figure of merit values. As such, the process has utility for improving the efficiency of experimental design and production of thermoelectric materials.

The process for determining an optimum range of compositions for a thermoelectric material system considers a variety of relevant factors, parameters and the like in order to determine which material systems should be considered and/or which range of compositions should be studied in more detail. A thermoelectric material exhibiting a dimensionless high figure of merit (ZT) needs to possess a high Seebeck coefficient (S) for high voltage generation, a low electrical resistivity ($\rho$) to minimize Ohmic losses and a low thermal conductivity (k) to minimize heat conduction.

The relationship between ZT, S, $\rho$, and k can be expressed as:

$$ZT = S^2 T/k\rho \qquad \text{Eqn 1}$$

and/or as:

$$ZT = \frac{S^2 T}{\rho(k_{el} + k_{ph})} \qquad \text{Eqn 2}$$

where $k_{el}$ and $k_{ph}$ are the electronic and phonon contribution to the overall thermal conductivity k.

Typically, S, $\rho$, and k are interdependent are interdependent with an increase of the Seebeck coefficient resulting in an increase in electrical resistivity, whereas a decrease in the electrical resistivity results in an increase of the thermal conductivity. At least one approach for obtaining high figure of merit values has investigated the insertion of nanoparticles within a thermoelectric material (U.S. Pat. No. 7,309,830). Materials using this approach can result in phonons being scattered by the nanoparticles, thereby reducing the lattice thermal conductivity while leaving the electrical resistivity and Seebeck coefficient for the thermoelectric host matrix unchanged.

Elemental substitutions, also known as atomic substitutions, in potential thermoelectric materials have imperfections on the order of 1 angstrom (Å). Thus alloying additions can result in the scattering of short-wavelength phonons much more effectively than mid- and long-wavelength phonons. Therefore, mid- and long-wavelength phonons dominate the heat conduction in alloys and thermoelectric materials that have been doped with other elements not originally within the starting material. In the alternative, the inclusion of additions such as nanoparticles in the size range of phonon wavelengths introduces another scattering mechanism that affects mid- and/or long-wavelength phonons, thereby providing an opportunity to reduce the thermal conductivity of such materials below the alloy limit. However, which nanoparticles with respect to their composition, size and size distribution, and which host matrix the nanoparticles should be added to has heretofore been a difficult task to predict. In response to the difficulty in predicting successful thermoelectric material systems, a process to perform just this task has been developed by Banerjee et al. (U.S. Pat. No. 7,734,428).

An embodiment of the process includes determining a material composition to be investigated for the nanocomposite thermoelectric material, the material composition including a conductive bulk material, also known as a matrix, and an insulating nanoparticle material present as inclusions within the matrix. Once the insulating nanoparticle material has been determined, a range of surface roughness values for the insulating nanoparticle material that can be obtained using current state of the art manufacturing techniques is determined. Thereafter, a plurality of Seebeck coefficients, electrical resistivity values, and thermal conductivity values for the material composition and as a function of the range of nanoparticle material surface roughness values can be calculated.

Once the Seebeck coefficients, electrical resistivity values and thermal conductivity values have been calculated, a corresponding range of figure of merit values can also be calculated and the generally maximum range for the figure of merit values can be determined. In this manner the generally maximum range of figure of merit values can be a function of the range of nanoparticle material surface roughness values and the determined material composition having nanoparticles with a desired surface roughness can be manufactured.

In the alternative to the above outlined embodiment, a plurality of material compositions can be investigated in a like manner and a single material composition or a limited range of compositions having a potential and desired ZT can be manufactured.

The nanoparticle material surface roughness can be obtained by etching the nanoparticles, in-situ growth of the nanoparticles, and the like. In the alternative, nanoparticles having a desired surface roughness can be obtained from a plurality of nanowires that have been broken to produce nanoparticles, the nanoparticles then subjected to a surface roughening process. In another alternative, a plurality of nanowires having a desired surface roughness can be broken into pieces to produce the nanoparticles. The surface roughness of the nanoparticles and/or the nanowires can be expressed by interfacial density and can have a range of interfacial density values between 0.1 and 1.0 nanometers$^{-1}$. In addition, or in the alternative, the nanoparticles or the nanowires can have a surface roughness expressed by roughness correlation length and roughness height, the range of roughness correlation lengths being between 0.1 to 10 nanometers and the range of roughness heights being between 0.1 and 8 nanometers.

Figure 1B:
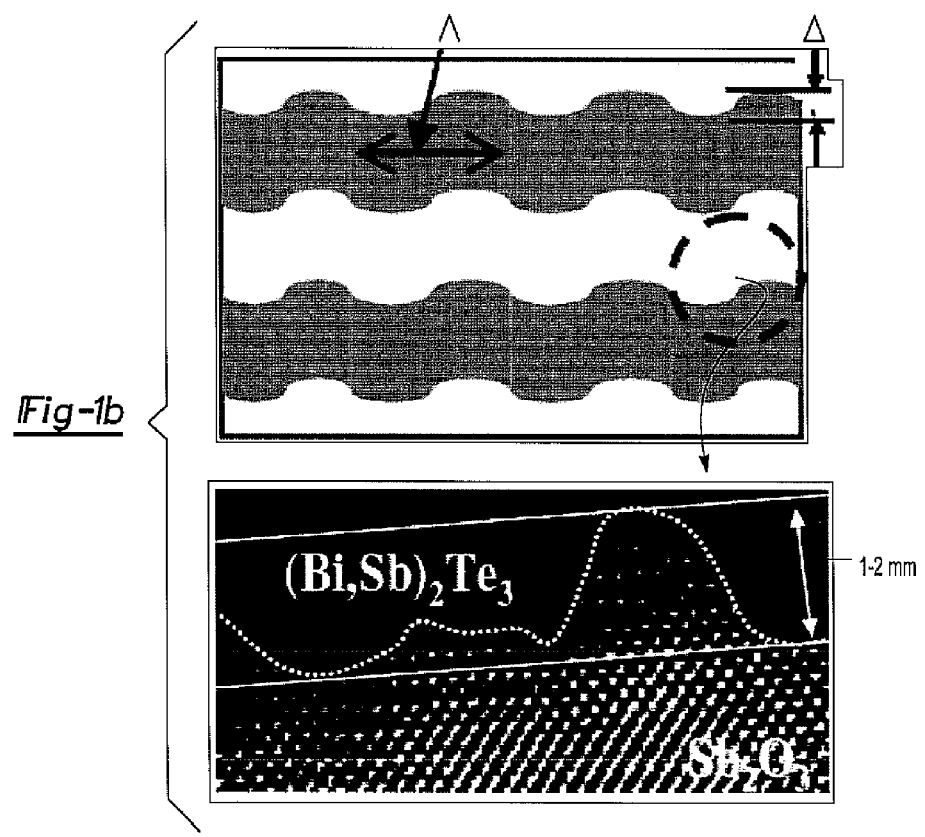

The terms "roughness correlation length" and "roughness height" are demonstrated in FIG. 1 which provides a schematic illustration of a nanocomposite thermoelectric material 100 having nanoparticles 110. As is obvious from FIG. 1A, the nanoparticles 110 have a rough outer surface. In some instances, the structure of the nanoparticles within the thermoelectric material can be modeled as a two-dimensional electron gas having a wave form or shape as shown in FIG. 1B. From this idolized model, the roughness correlation length ($\Lambda$) measures one cycle of the wave structure, for example one maximum height to an adjacent maximum height. In addition, the roughness height ($\Delta$) is measured as the distance between the maximum surface roughness height and the adjacent valley or trough depth. It is of interest to note that actual nanocomposite thermoelectric materials can have nanoparticle inclusions that do have a surface roughness that is similar to the shape of the idealized 2D electron gas model shown in FIG. 1B. In particular, FIG. 1C provides a transmission electron microscope image of an interface between a $Sb_2O_3$ nanoparticle and a $(Bi,Sb)_2Te_3$ matrix for a nanocomposite thermoelectric material. As shown in FIG. 1C, the surface roughness height is on the order of 1 to 2 nanometers.

In order to incorporate surface roughness of nanoparticle inclusions into a modeling and/or manufacturing process, the scattering behavior of electrons, holes, and/or phonons within a material can be useful. Not being bound by theory, a theoretical simulation can be based on the Boltzmann equation with relaxation time approximation. For example, a modified Callaway model with respect to the lattice of a thermoelectric material can be incorporated with scattering of phonons through grain boundaries, defects, nanoparticles, and the like provided by Equation 3 below:

$$\tau_c^{-1} = \tau_B^{-1} + \tau_U^{-1} + \tau_N^{-1} + \tau_A^{-1} + \tau_{NP}^{-1} \qquad \text{Eqn 3}$$

where $\tau$ corresponds to scattering time and the subscripts B, U, N, A and NP correspond to boundary, Umpklamp, normal, alloy, and nanoparticle, respectively, related scattering.

With respect to carriers, that is electrons and holes, Equation 4 can be used where Op, DOp, DAp, NPc and Bc represent optical phonon, deformation potential of optical phonon, deformation potential of acoustic phonon, carrier nanoparticle and carrier boundary related scattering.

$$\tau_\xi^{-1} = \tau_{Op}^{-1} + \tau_{DOp}^{-1} + \tau_{DAp}^{-1} + \tau_{NPc}^{-1} + \tau_{Bc}^{-1} \qquad \text{Eqn 4}$$

In addition to scattering time, the total electrical conductivity can be expressed as a summation of the contributions from both electron and hole bands, while the overall Seebeck coefficient can be obtained through weighting each band's contribution using a normalized electrical conductivity. In order to obtain the electronic thermal conductivity, the electronic thermal conductivity from the Lorentz number (L) can be obtained using Equations 5-7 below. In particular, Equation 5 is an expression of the total electrical conductivity ($\sigma$), Equation 6 is an expression of the overall Seebeck coefficient, and Equation 7 is an expression for the electronic thermal conductivity. It is appreciated that the bipolar thermal conductivity contribution to the electronic thermal conductivity must also be considered and that this type of conduction occurs when carriers moving between different bands carry heat via the Peltier effect and as such can still transport heat even if the net electric current is zero.

$$\sigma = \sum_i^{e,h} \sigma_i \qquad \text{Eqn 5}$$

$$S = \sum_i^{e,h} \frac{S_i \sigma_i}{\sigma} \qquad \text{Eqn 6}$$

$$k_e = \left(\frac{k_B}{e}\right)^2 \left(\sum_i^{e,h} L_i + L_b\right) \sigma T \qquad \text{Eqn 7}$$

Estimates of the effect of interface roughness between a matrix and a nanoparticle inclusion on mobility within the material can be imprecise since the roughness itself can be difficult to model. Not being bound by theory, an embodiment of the present invention assumes that fluctuations at the interface are randomly correlated spatially and can be described using a Gaussian distribution. In addition, and regarding the interaction between an electron and the interface, the variation in the potential that the electron experiences is assumed to be based on a first-order Taylor expansion of the confining potential as shown in Equation 8.

$$\Delta V(\vec{r}) = \frac{e^2 N_s}{2\varepsilon_s} \Delta V(\vec{r}) \qquad \text{Eqn 8}$$

Taking Equation 8 as the perturbation and assuming a correlation of the form:

$$\langle \Delta(\vec{r}) \Delta(\vec{r}\,' - \vec{r}) \rangle = \Delta^2 e^{-r^2/\Lambda^2}, \qquad \text{Eqn 9}$$

the scattering rate of electrons due to interfacial surface roughness can be represented by:

$$\frac{1}{\tau_{ir}(E)} = \left(\frac{e^2 N_s \Delta \Lambda}{2\varepsilon_s}\right)^2 \frac{m^*}{\hbar^3} J_{in}(k) \qquad \text{Eqn 10}$$

where E is the electron energy and:

$$J(k) = \int_0^{2k} \frac{e^{-\frac{q^2\Lambda^2}{4}}}{2k^3(q+q_s)^2 \sqrt{1-\left(\frac{q}{2k}\right)^2}} q^4 \, dq \qquad \text{Eqn 11}$$

and $$q_s = \frac{e^2 m^*}{2\pi \varepsilon_s \hbar^2} F(q) \qquad \text{Eqn 12}$$

and $$F(q) = \int_0^\infty dz \int_0^\infty dz' [f(z)]^2 [f(z')]^2 e^{-q|z-z'|} \qquad \text{Eqn 13}$$

where f(z) is the Fang-Howard vibrational wave function, $\varepsilon_s$ is a static dielectric constant, and m* is the electron effective mass. In addition, $N_s$ is the surface carrier concentration for the case of a 2D electron gas and the electron wave vector $k=2\pi/\lambda_e$. As such, the total scattering time for an electron can be represented as:

$$\tau_g^{-1} = \tau_{Op}^{-1} + \tau_{DOp}^{-1} + \tau_{DAp}^{-1} + \tau_{NP}^{-1} + \tau_B^{-1} + \tau_{ir}^{-1}. \qquad \text{Eqn 14}$$

where ir represents interface roughness.

The rate of momentum relaxation of phonons due to a Gaussian interfacial roughness can be represented by:

$$\frac{1}{\tau_{ir}} = (\delta \omega_{AB})^2 \frac{\omega_o}{2u_l^2} \Lambda^2 \alpha^2 Z_p \qquad \text{Eqn 15}$$

where $\delta\omega_{AB}$ is the difference in mode frequency for the two materials forming the interface and α is the probability for a phonon to be in the region of interfacial surface roughness. In addition, $\omega_0$ is the average phonon frequency and $u_l$ is the sound velocity.

The factor α for confined phonons can be represented by:

$$\alpha = \left[1 - \frac{q_z^2 - k^2}{q_z^2 + k^2} \frac{\sin(2q_z\Delta)}{2q_z\Delta}\right] \frac{\Delta}{L} \qquad \text{Eqn 16}$$

Where:

$$q_z = n\pi/L \qquad \text{Eqn 17}$$

and $Z_p$ can be represented by:

$$Z_p = \int_0^{2\pi} (1 - \cos\theta) e^{[-q^2\Lambda^2 \sin^2\theta/2]} d\theta \qquad \text{Eqn 18}$$

The phonon wave vector related to phonon frequency can also be represented by $$\omega^2 = \omega_o^2 - u_l^2(q^2 - q_z^2) \qquad \text{Eqn 19}$$

such that the case of total scattering for phonons is:

$$\tau_c^{-1} = \tau_B^{-1} + \tau_U^{-1} + \tau_N^{-1} + \tau_A^{-1} + \tau_{NP}^{-1} + \tau_{ir}^{-1} \qquad \text{Eqn 20}$$

Figure 2:
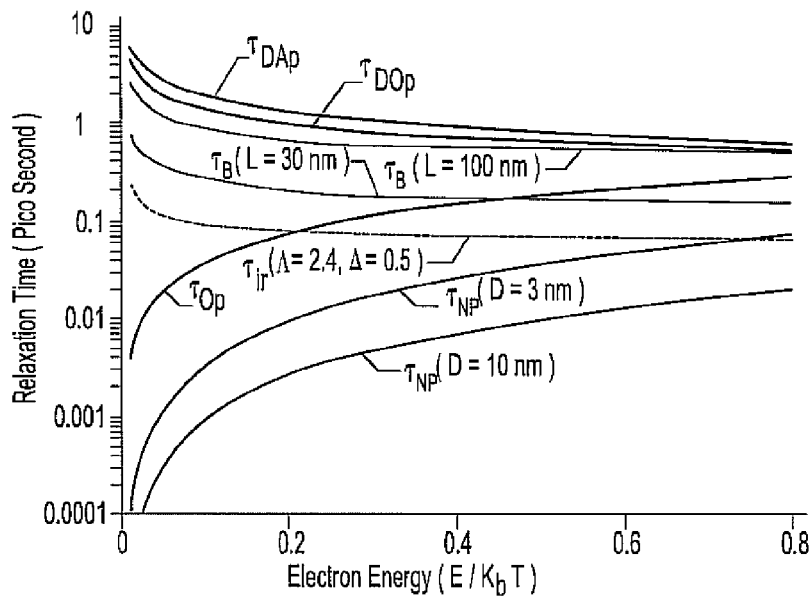
FIG. 2 is a graphical representation of calculated relaxation times for various electron scattering mechanisms in a nanocomposite thermoelectric material sample.

Using these expressions, the effect of surface roughness scattering for electrons and holes can be determined by comparing calculated relaxation times for various scattering processes as shown in FIG. 2 with a smaller or lower relaxation time the result of a stronger scattering effect. As shown in the figure, the most effective scattering mechanism is due to scattering afforded by nanoparticles ($\tau_{NP}$), however such an effect is reduced with increasing nanoparticle size as illustrated by comparing the curve for nanoparticles with a diameter of 3 nanometers ($\tau_{NP}$(D=3 nm)) to the curve for nanoparticles with a diameter of 10 nanometers ($\tau_{NP}$(D=10 nm)). In addition, interfacial surface roughness scattering ($\tau_{ir}$) can be comparable to optical phonon and nanoparticle scattering at high electron energies with increasing electron energy resulting in an increase in the effect of interfacial surface roughness scattering. The grain boundary and deformation potentials also increase with higher energy electrons. As such, calculations as represented by FIG. 2 illustrate that interfacial surface roughness can have an effect on thermoelectric properties, particularly for mid to high energy electrons/holes.

Figure 3:
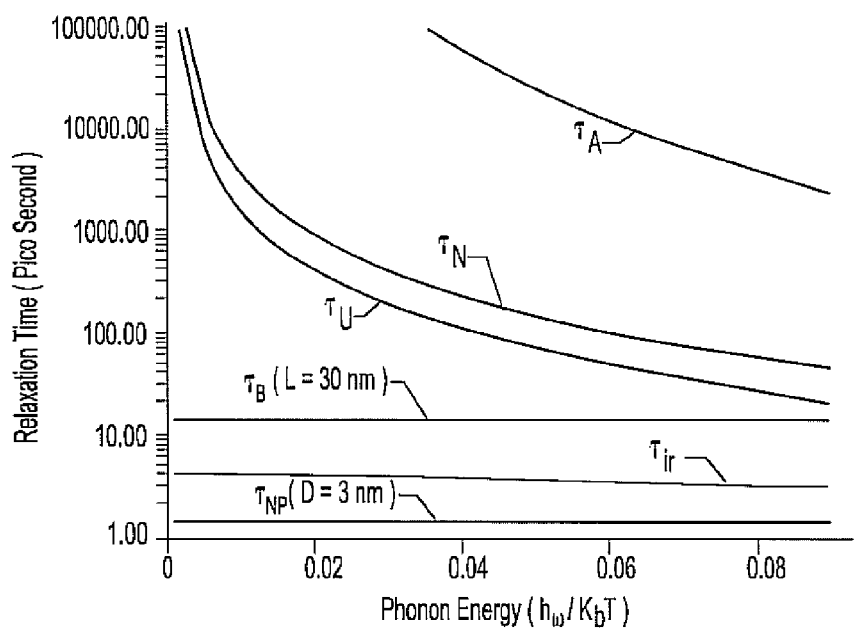
FIG. 3 is a graphical representation of calculated relaxation times for various phonon scattering mechanisms in a nanocomposite thermoelectric material sample.

Regarding phonon scattering, $\delta\omega_{AB}$ in the case of $Bi_2Te_3$—$SiO_2$ nanocomposite has been calculated to be of the order of $10^{12}$ seconds$^{-1}$. The calculated relaxation times as a function of phonon energies are illustrated in FIG. 3 with dominant scattering afforded by nanoparticles, interfacial surface roughness, and grain boundaries. It is appreciated that the strongest effect among these scattering mechanisms is determined by the size of second phase nanoparticle inclusions, the grain size, roughness parameters, all of which are complicated to estimate theoretically.

For the calculations illustrated in FIGS. 2 and 3, nanoparticles having a diameter of 3 nanometers (D=3 nm) and 10 nanometers (D=10 nm) with a 1 nanometer size distribution were assumed. In addition, a grain of 30 nanometers (L=30 nm) was used in the calculations. Regarding interfacial roughness parameters, a correlation length (Λ) of 2.4 nanometers and a roughness height (Δ) of 0.5 nanometers were also assumed. Although estimation of the exact effect of grain size, roughness parameters, and second phase inclusions is difficult to model, FIG. 3 does illustrate that the natural crystal related relaxation times such as normal, Umpklamp, and alloys scattering are overpowered by artificial scattering mechanisms which may or may not be altered.

Figure 4:
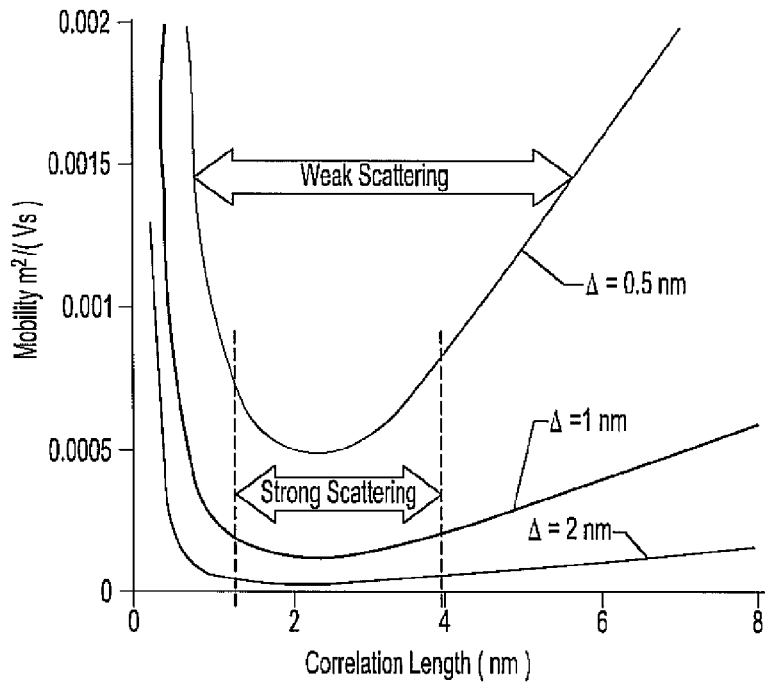
FIG. 4 is a graphical representation of carrier mobility as a function of roughness correlation length ($\Lambda$) and roughness height ($\Delta$)

Regarding the effect of roughness parameters alone on scattering, FIG. 4 illustrates the effect of correlation length and roughness height on hole mobility using an equation similar to $\mu_{tr}=(e/m^*)\tau_{tr}$. The roughness height was varied from 0.5 to 2 nanometers while the correlation length was varied from 0 to 8 nanometers. As illustrated in FIG. 4, a correlation length between 1 to 4 nanometers afforded the strongest effect on scattering with 2.4 nanometers having the maximum effect. In addition, and as expected, increasing roughness height showed an increasing effect on scattering.

Figure 5:
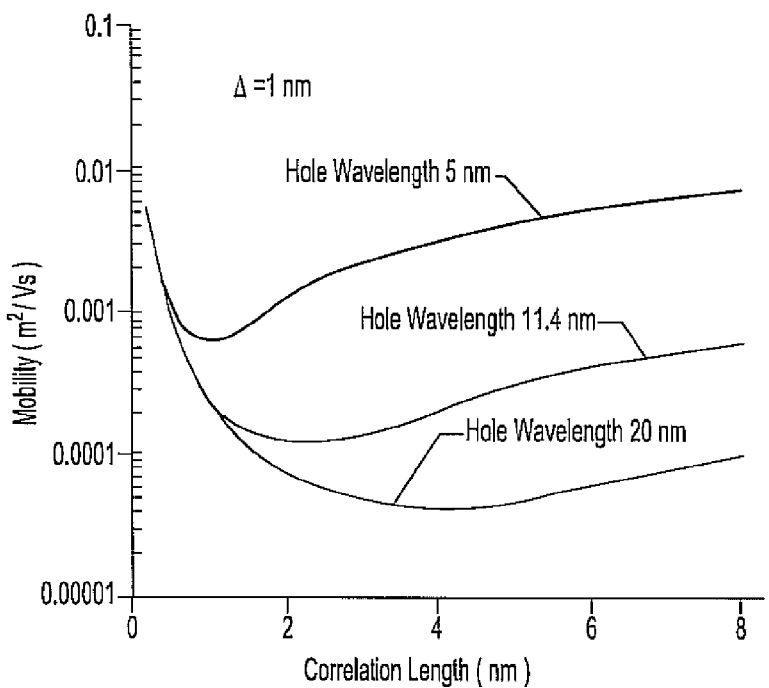
FIG. 5 is a graphical representation of calculated carrier mobility as a function of roughness correlation length and carrier energy represented by carrier wavelength.

Referring now to FIG. 5, hole mobility as a function of correlation length and carrier energy is provided and illustrates that high energy holes (smaller wavelength) are less affected by roughness scattering. Nevertheless, a region of strong scattering effect within a range of correlation lengths is observed.

As is known to those skilled in the art, a desired nanocomposite thermoelectric material is expected to provide improved or increased ZT due to strong phonon scattering and weak electron scattering afforded by the plurality of interfaces such as grain boundaries and matrix/nanoparticle interfaces. As such, and in an effort to compare electron scattering and phonon scattering within a nanocomposite thermoelectric material, calculations represented by FIG. 6 were performed with scattering or relaxation time in picoseconds for electrons shown on the left vertical axis and for phonons shown on the right vertical axis as a function of roughness correlation length. A roughness height of 1 nanometer was assumed.

As shown in FIG. 6, electron scattering increased with high carrier density while for phonon scattering, an increase in correlation length and interparticle distance result in weakening thereof. Also observed from FIG. 6 is a minimum in electron and phonon scattering time, thus illustrating an intermediate range for roughness parameters that can provide optimum scattering effects and thus optimum ZT. As such, it is appreciated that to take advantage of surface roughness, roughness parameters and electron carrier density must be optimized to generate weak electron scattering and strong phonon scattering.

Referring now to FIG. 7, a schematic illustration of a model for surface roughness of an interfacial area between a nanoparticle and a matrix is provided. It is assumed that a rough surface between the nanoparticle and the matrix increases the surface area therebetween and thereby increases scattering of phonons. The model also assumes a nanoparticle having radius R with a plurality of small sphere-shaped surfaces populating the surface. In fact, the small spheres are assumed to completely cover the nanoparticle surface, although strictly speaking this is not true due to a packing ratio of small spheres on the surface of the nanoparticle being less than 100%. The radius of the small spheres is defined as r, the distance from one sphere maximum height to an adjacent sphere maximum height is defined as 4c=Λ, and the distance between the top of a small sphere and the bottom of a valley adjacent thereto is defined as 2h=2Δ. The volume (V) and surface area (S) can be expressed as:

$$V = \frac{\pi}{6}h(3c^2 + h^2) \quad \text{Eqn 21}$$

$$S = \pi(c^2 + h^2) \quad \text{Eqn 22}$$

where $$c=\sqrt{h(2r-h)} \quad \text{Eqn 23}$$

It is appreciated that since the correlation length equals 4c (Λ=4c) the equation for r can be derived as:

$$r = \frac{1}{4}\left(\frac{\Lambda^2}{4\Delta} + \Delta\right) \quad \text{Eqn 24}$$

Including the effect of nanoparticle standard deviation, the interfacial surface area can be calculated as:

$$Aiv = \frac{3UFT_a}{T_v} \quad \text{Eqn 25}$$

where:

$$T_a = \int_0^\infty r^2 \frac{r^{A-1}e^{-r/B}}{B^A\Gamma(A)} dr \quad \text{Eqn 26}$$

$$T_v = \int_0^\infty r^3 \frac{r^{A-1}e^{-r/B}}{B^A\Gamma(A)} dr \quad \text{Eqn 27}$$

$$F = \frac{2r}{2r - \Delta/2} \quad \text{Eqn 28}$$

Figure 8:
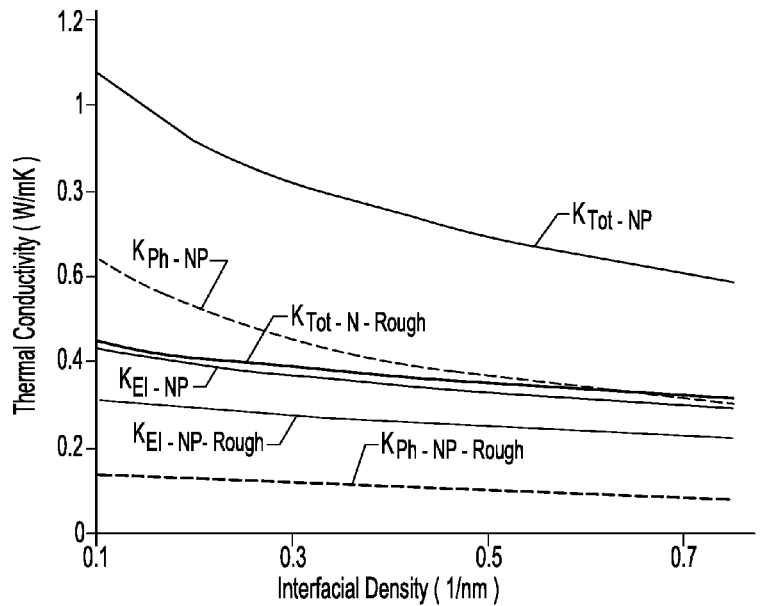
FIG. 8 is a graphical representation of phonon, electron, and total thermal conductivity as a function of interfacial density for a nanocomposite thermoelectric material having a smooth matrix/nanoparticle interface and a nanocomposite thermoelectric material having a rough matrix/nanoparticle interface.

Based on the above derivation of volume and surface area, the effect of interfacial density (S/V) on thermoelectric properties was calculated. For example, FIG. 8 provides a graphical representation of the effect of interfacial density on electron, phonon, and total thermal conductivity for a $Bi_2Te_3$—$SiO_2$ nanocomposite thermoelectric material in which an average diameter of 3 nanometers, a roughness correlation length of 2.4 nanometers, a roughness height of 0.5 nanometers, a grain size of 30 nanometers, and a grain boundary barrier height of 60 milli-electron volts were assumed. As shown in the figure, the nanocomposite material having a rough matrix/nanoparticle interface has a significantly reduced thermal conductivity compared to the material not having a rough matrix/nanoparticles interface.

Figure 9:
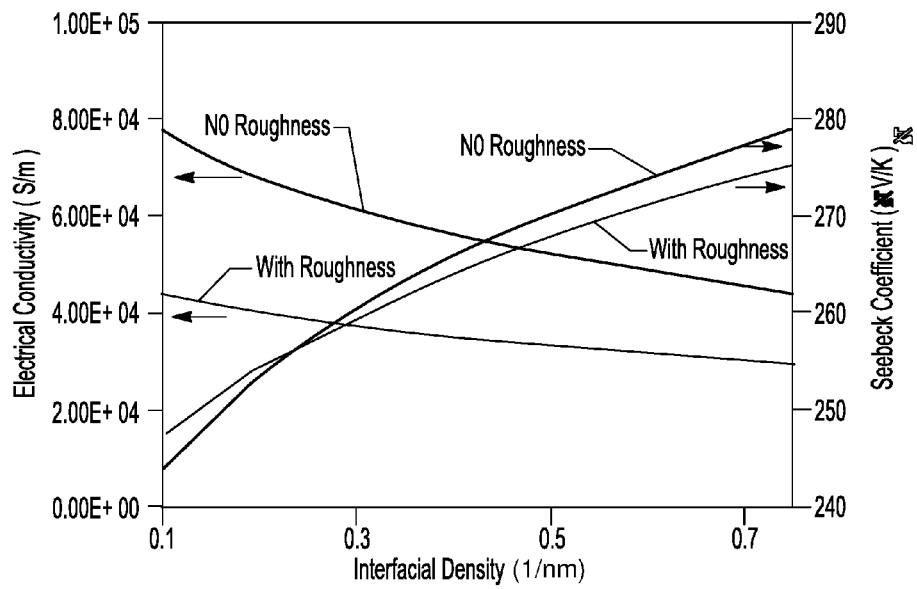
FIG. 9 is a graphical representation of electronic conductivity and Seebeck coefficient as a function of interfacial density for a nanocomposite thermoelectric material with and without matrix/nanoparticles interfacial roughness.

It is evident that the effect of interfacial roughness can be significant in reducing thermal conductivity of a nanocomposite material. Regarding electrical conductivity and Seebeck coefficient for such a material, FIG. 9 provides a graphical representation for the effect of interfacial density on these material properties. An average phonon energy of 0.008 electron volts was assumed, which is appreciated to be relatively close to literature values suggested for $Bi_2Te_3$. As shown in FIG. 9, the effect of interfacial surface roughness is quite pronounced for the electrical conductivity, for example reducing the electrical conductivity by 50% at low interfacial density values while averaging around 30 to 40 percent at higher interfacial density values. Regarding the Seebeck coefficient, such a large difference was not observed.

Figure 10:
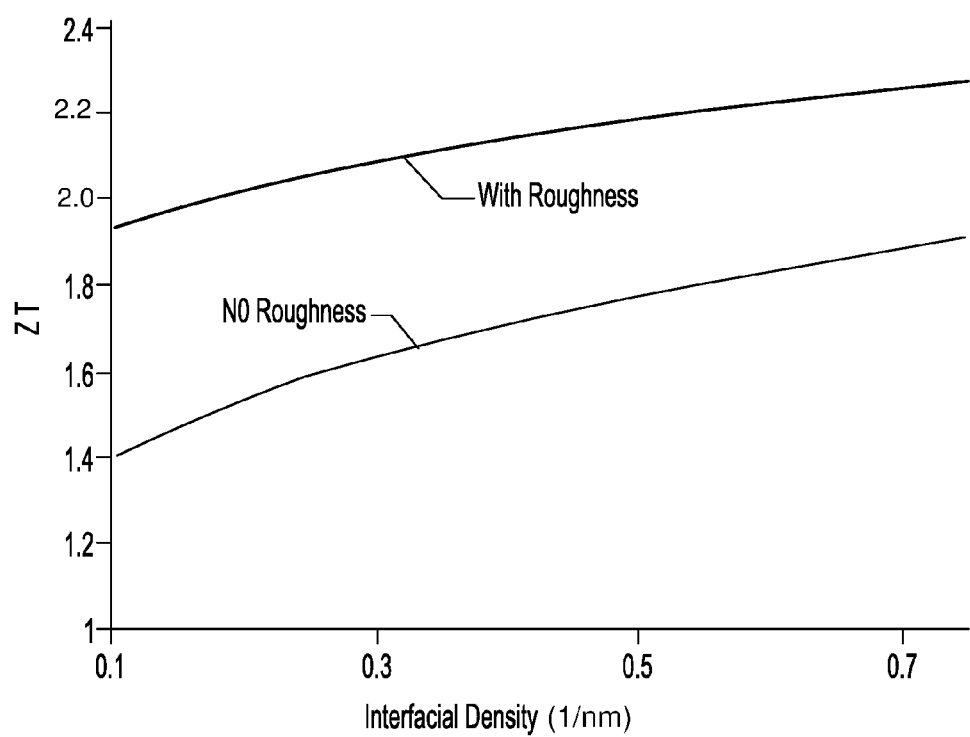
FIG. 10 is a graphical representation of dimensionless figure of merit (ZT) as a function of interfacial density for a nanocomposite thermoelectric material with and without matrix/nanoparticles interfacial roughness.
Figure 11:
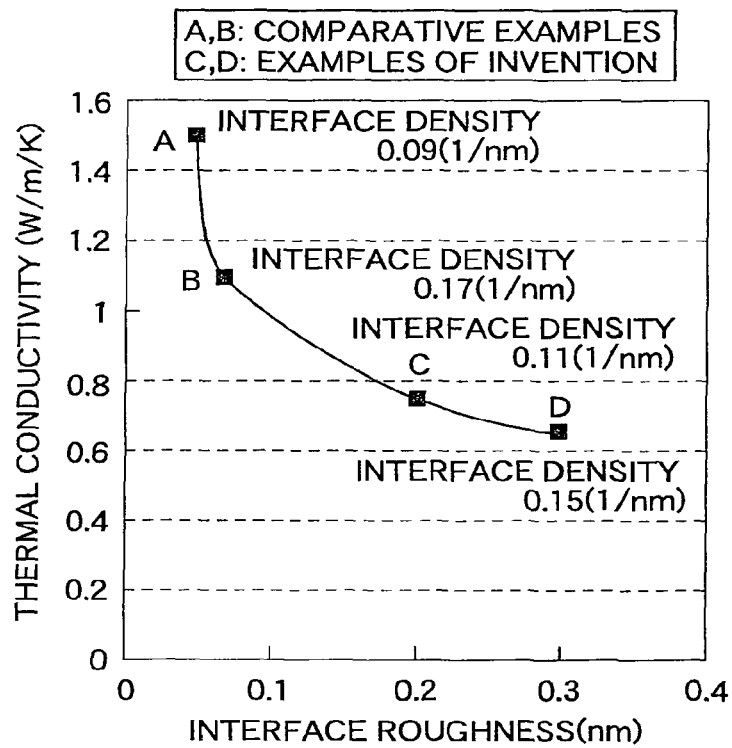
Figure 12:
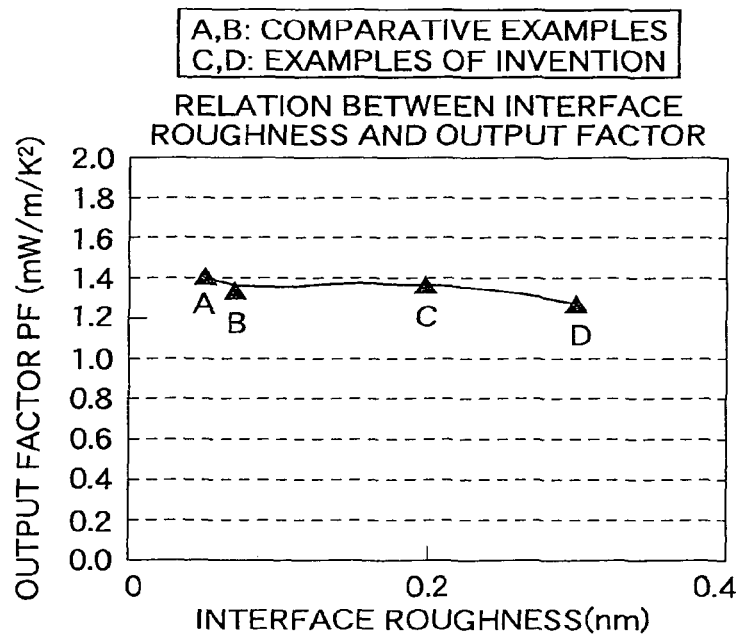
Figure 13:
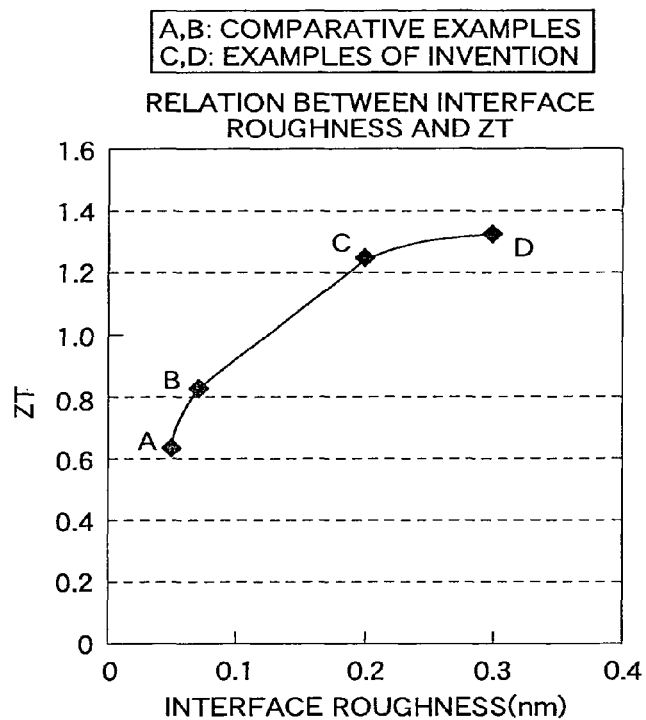
Figure 14:
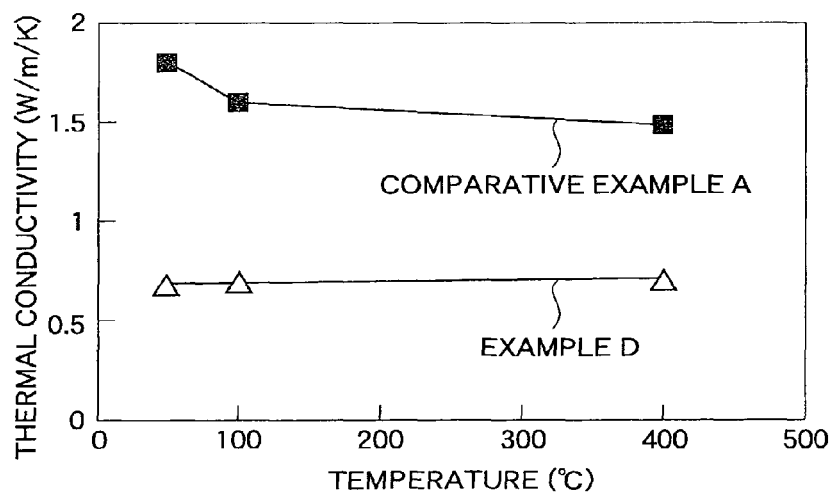
Figure 15:
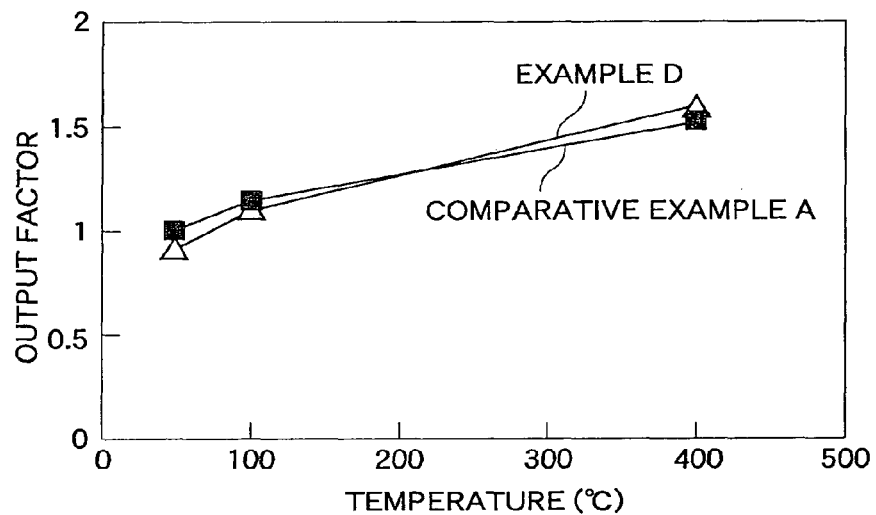
Figure 16:
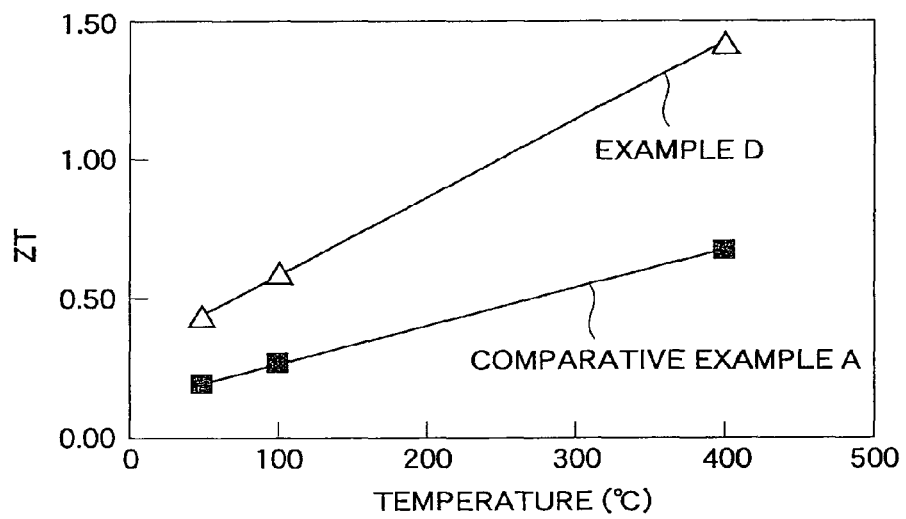

Despite the reduction in electrical conductivity and Seebeck coefficient for a rough interface, the overall ZT for the nanocomposite thermoelectric material was observed to increase for a rough interface as illustrated in FIG. 10. It is appreciated that the increase in ZT was observed to be the greatest at low values of interfacial density. In addition, it is important to note that a specific roughness correlation length and roughness height were assumed for the results shown in FIG. 10, and that additional calculations that optimize the surface roughness parameters to provide a maximum ZT can be calculated and are within the scope of the present invention.

It is appreciated that the process of calculating the thermal conductivity and electrical resistivity for a given nanocomposite material system as a function of material compositions affords for the calculation of figure of merit values as a function of the compositions. In this manner, researchers can estimate which matrix/host-nanoparticle/interface roughness systems are more likely to exhibit relatively high ZT values and/or which compositions, range of compositions or range of interfacial roughness within a particular system may provide the highest ZT values. This range of compositions and/or interfacial roughness with the associated high ZT values can also be compared with other material properties such as mechanical property data, chemical property data and the like, in order to choose an optimum nanocomposite thermoelectric material composition and/or nanoparticle surface roughness for a given application. As such, the process provides a valuable tool to guide experimental design of thermoelectric materials.

The plurality of material compositions to be investigated can include a first component with a volume fraction of a second component ranging from 0.0 to 1.0. In some instances, the material compositions to be investigated can include the first component with a volume fraction of the second component ranging from 0.0 to 0.7. The plurality of thermal conductivity values are calculated as a function of the scattering cross section of the second component nanoparticles and/or matrix/nanoparticles interface roughness for the plurality of material compositions being investigated. In addition, the scattering cross section can be a function of the interfacial surface area of the second component nanoparticles for the plurality of material compositions being investigated. The function of the plurality of material compositions being investigated can include the size of the second component nanoparticles, the size distribution of the second component nanoparticles and an interfacial property of the second component nanoparticles. In some instances, an interfacial interaction property between the second component nanoparticles and the first component can be used.

It is appreciated that the thermoelectric device can be designed and developed using the process disclosed herein, the thermoelectric device having a first electrical contact, a second electrical contact, and a thermoelectric bulk material located within an electrical path between the first electrical contact and the second electrical contact. The thermoelectric bulk material can include a first powdered component having a particulate form, the first powdered component being electrically conducting, and a second powdered component having a particulate form, the second powdered component having an electrical conductivity substantially less than the first powdered component. The first and second powdered components can retain the particulate form in the bulk thermoelectric material and the thermoelectric bulk material can be a composite that has nanostructures of the first powdered component. The first component can be a metal or a semiconductor. The second component can be an electrical insulator in the form of a ceramic. It is appreciated that the process can also be used for semiconductor-metal and semiconductor-semiconductor thermoelectric material systems.

According to the above-described method, it is possible to produce the powder or the bulk body of the nanocomposite thermoelectric conversion material according to the invention. In the nanocomposite thermoelectric conversion material according to the invention, the nanoparticles of the dispersed material are dispersed in the matrix of the thermoelectric conversion material as described above. The roughness of the interface between the matrix of the thermoelectric conversion material and the nanoparticles of the dispersed material is equal to or larger than 0.1 nm, preferably 0.1 to 0.6 nm. The density of the interface between the matrix of the thermoelectric conversion material and the nanoparticles of the dispersed material (i.e., the ratio of the contact area between the matrix and the nanoparticles to unit volume) is preferably 0.02 to 3 (1/nm), more preferably 0.06 to 1.8 (1/run), and furthermore preferably 0.1 to 1.8 (1/nm).

EXAMPLES

Hereinafter, examples of the invention will be described. In the examples described below, the produced nanocomposite thermoelectric conversion material was evaluated according to a method described below.

1. Production of Transmission Electron Microscope (TEM) specimen

Pieces, each of which has the size of 1 to 2 mm×1 to 2 mm, were cut out from a sintered body with the size of a diameter 10 mm×1 to 2 mm, using Isomet. Then, each piece was subjected to mechanical polishing until the thickness of the piece became equal to or smaller than 100 μm. Thus, specimens were produced. Then, each specimen was adhered to a Cu mesh for TEM using an adhesive agent (called Araldite), and drying was performed. Then, a portion of the specimen was subjected to mechanical polishing until the thickness of the portion became equal to or smaller than 20 μm, using a dimple grinder (manufactured by GATAN, Inc.). Then, the thinned portion of the specimen was further thinned until the thickness of the thinned portion of the specimen became 10 to 100 nm, using an Ar ion milling system (manufactured by GATAN, Inc).

2. TEM Observation

TEM observation was performed on the thinned portion whose thickness was made equal to or smaller than 100 nm in the specimen production process. The TEM observation was performed under the following condition. The model of a device used for the observation was Tecnai G2 S-Twin TEM (manufactured by FEI company). Accelerating voltage was 300 kV.

3. Analysis of Interface Roughness

The high-resolution TEM images of the specimens were taken, and were directly observed. Image analysis was performed by performing a fast Fourier transformation (FFT) and an inverse fast Fourier transformation (IFFT) on the taken high-resolution images, thereby taking out only lattice information. Thus, the average value of the interface roughness was determined.

4. Measurement of the Thermal Conductivity.

The thermal conductivity was measured by a thermal conductivity evaluation method (steady method), and a flash method (an unsteady method) (using a thermal conductivity measurement device (manufactured by NETZSCH) that measures the thermal conductivity using the flash method).

5. Output Factor

The Seebeck coefficient and the specific resistance were measured using ZEM manufactured by ULVAC-RIKO, Inc. The Seebeck coefficient was determined based on ΔV/ΔT using a three-point fitting. The specific resistance was measured by a four-terminal method.

6. Measurement of the Interface Density

The diameters of approximately 500 to 700 particles were measured by TEM. Then, the interface density was calculated based on the averaged diameter of the 10 particles.

First and Second Comparative Examples

Figure 18:
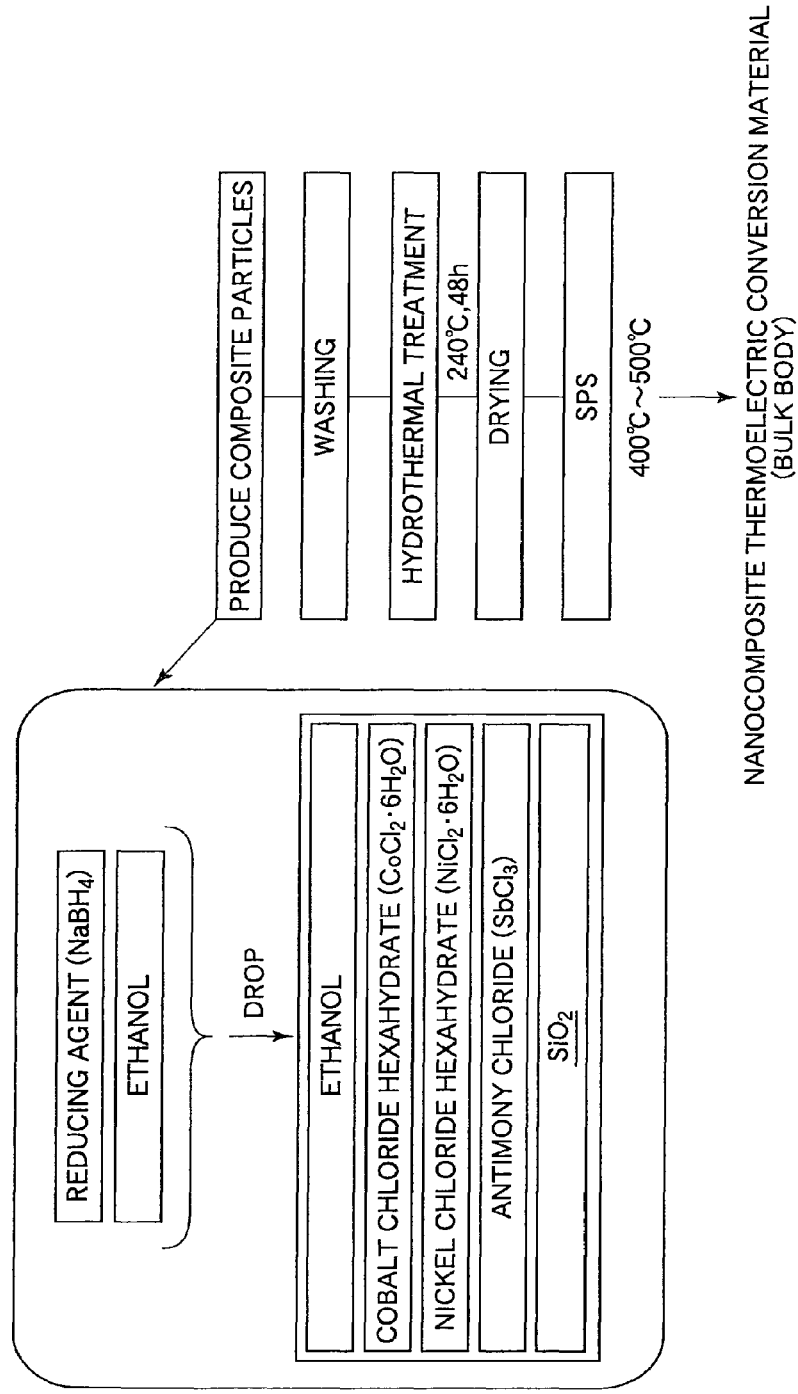

In each of the first and second comparative examples, the nanocomposite thermoelectric conversion material was produced according to the production process shown by the flowchart in FIG. 18. Propylene glycol monomethyl ether (PGM) slurry containing $SiO_2$ particles (average diameter: 5 nm) was used. In the first comparative example, the reducing agent was dropped at the dropping rate of 10 ml/minute, and a nanocomposite thermoelectric conversion material A was produced. In the second comparative example, the reducing agent was dropped at the dropping rate of 600 ml/minute, and a nanocomposite thermoelectric conversion material B was produced. The density of the $SiO_2$ interface in the produced nanocomposite thermoelectric conversion materials A and B was 0.09 to 0.17 (1/nm). FIG. 11 to FIG. 16 show the result of evaluation on characteristics of the nanocomposite thermoelectric conversion materials A and B.

First and Second Examples

Figure 17:
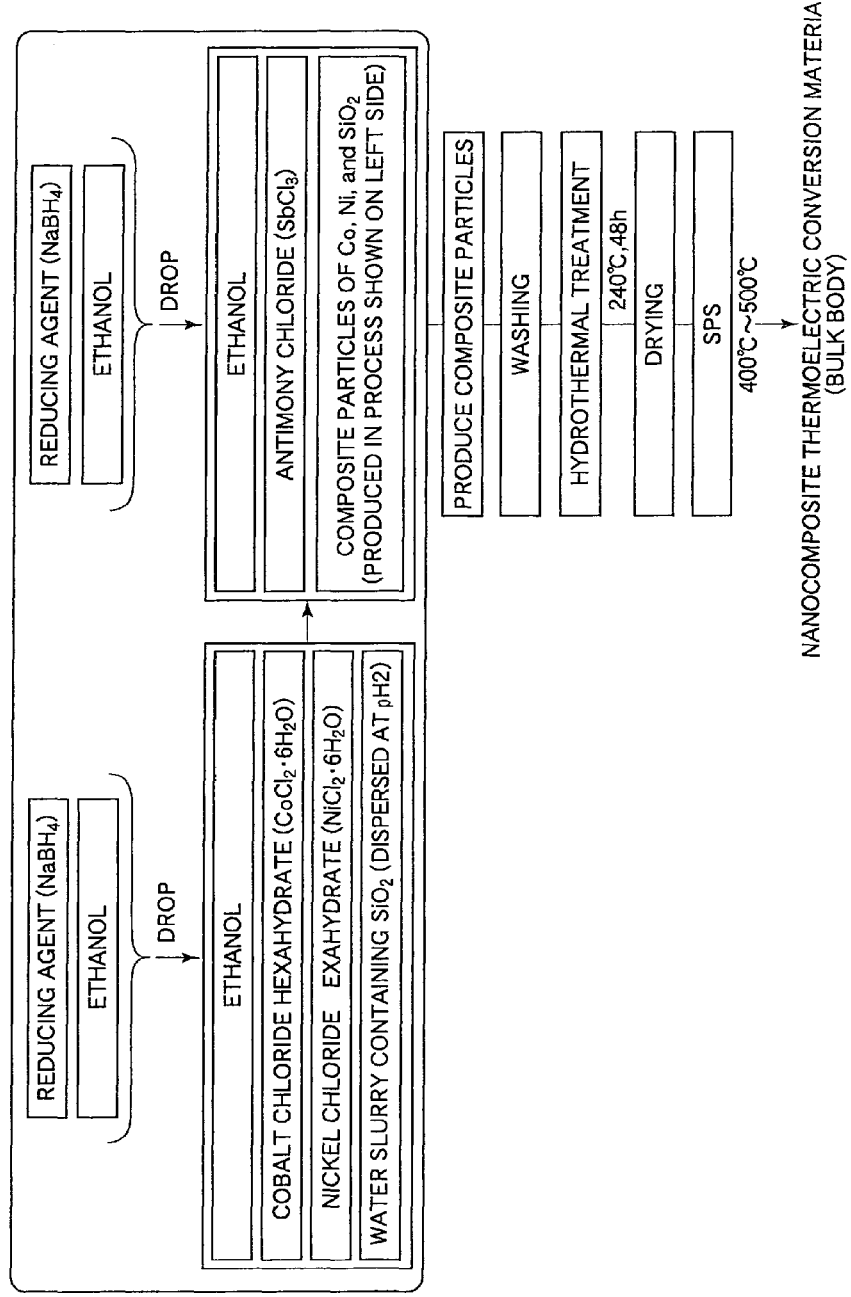

In each of the first and second examples, the nanoparticles were synthesized in two steps, according to the production process shown in the flowchart in FIG. 17. The amounts of ingredients will be described in an order in which the ingredients are arranged from an upper position to a lower position in FIG. 17. In the first step, the amount of the reducing agent ($NaBH_4$) was 0.4 g, the amount of ethanol was 50 ml, the amount of ethanol was 50 ml, the amount of cobalt chloride hexahydrate ($CoCl_2 \cdot 6H_2O$) was 0.895 g, the amount of nickel chloride hexahydrate ($NiCl_2 \cdot 6H2O$) was 0.057 g, and the amount of water slurry containing $SiO_2$ particles (the average diameter of the particles: 5 nm, $SiO_2$: 10 mass %, $SiO_2$ particles are dispersed at pH2) was 2.4 g. In the second step, the amount of the reducing agent ($NaBH_4$) was 1.8 g, the amount of ethanol was 100 ml, the amount of ethanol was 100 ml, and the amount of antimony chloride ($SbCl_3$) was 2.738 g. In addition, all the amount of the composite particles produced in the first step was used in the second step. In the first example, the reducing agent was dropped at the dropping rate of 10 ml/minute, and a nanocomposite thermoelectric conversion material C was produced. In the second example, the reducing agent was dropped at the dropping rate of 600 ml/minute, and a nanocomposite thermoelectric conversion material D was produced. The ethanol slurry containing the nanoparticles produced in the second step was filtered and washed using the mixed solvent produced by mixing 500 ml of water with 300 ml of ethanol. Then, filtering and washing were further performed using 300 ml of ethanol. After the second step was completed, processes were performed in succession without performing washing.

After the first step and the second step were completed, the composite nanoparticles were placed in a hermetically-sealed autoclave device, and an alloy was produced by hydrothermally-treating the composite nanoparticles at 240° C. for 48 hours. Then, drying was performed in a nitrogen gas flow atmosphere, and the produced powder was collected. As a result, approximately 2.0 g of powder was collected. Spark plasma sintering (SPS) was performed on the produced powder at 400 to 500° C. Thus, the bulk body of the nanocomposite thermoelectric conversion material was produced. The average diameter of the $SiO_2$ particles in the produced bulk body was 10 to 20 nm, and the interface density in the bulk body was 0.11 to 0.15 (1/nm). FIG. 11 to FIG. 16 show the result of evaluation on the thermoelectric conversion characteristics of the produced nanocomposite thermoelectric conversion materials (C and D), together with the result of evaluation on the characteristics of the nanocomposite thermoelectric conversion materials in the first and second comparative examples.

Third Comparative Examples

A third comparative example is the same as the first example, except that the reducing agent ($NaBH_4$) was not dropped in the first step. When $NaBH_4$ was dropped into the solvent containing water in the second step, the solvent was made cloudy, antimony oxychloride was produced, and the desired thermoelectric conversion material was not produced.

Fourth to Sixth Comparative Examples

Figure 19:
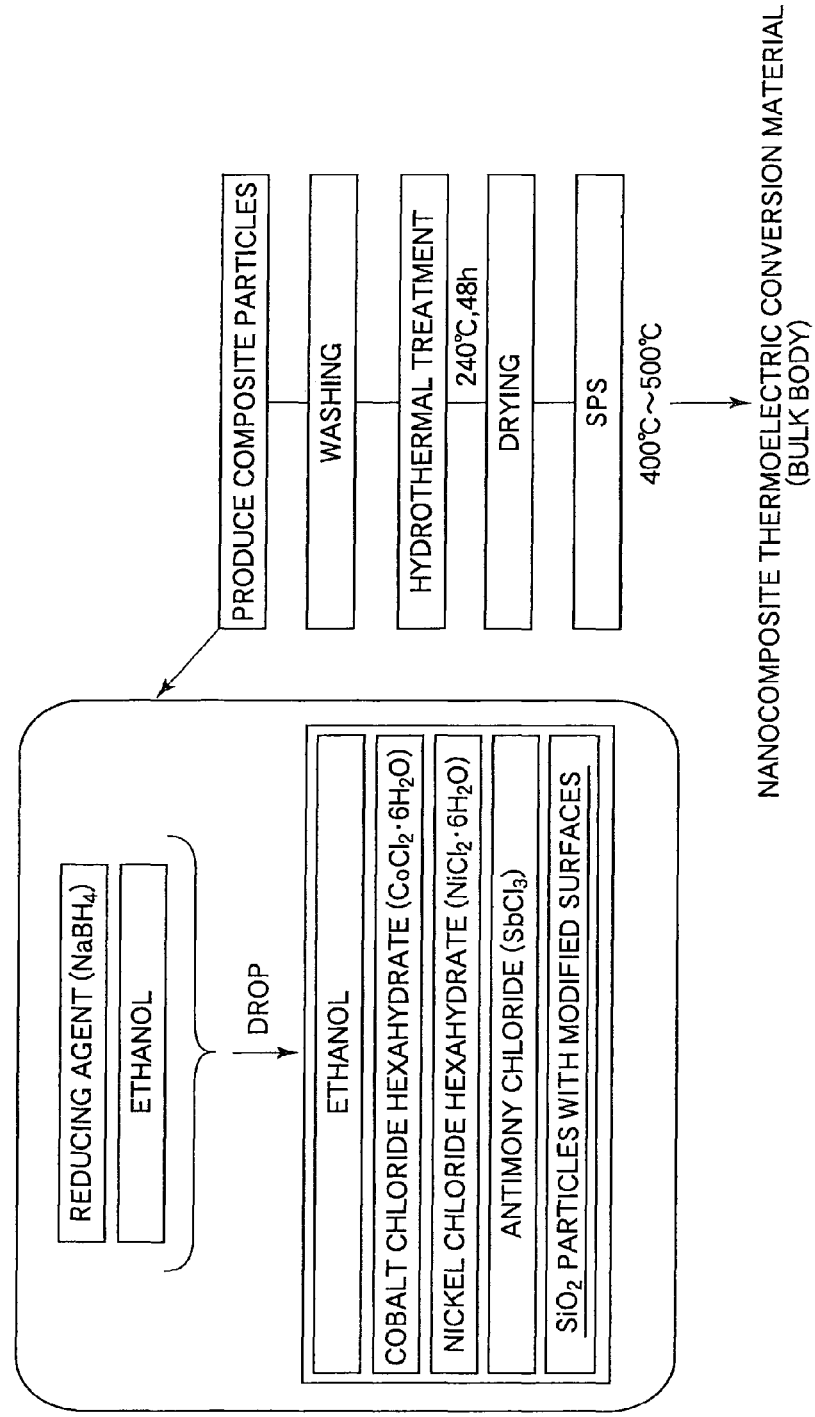
Figure 20:
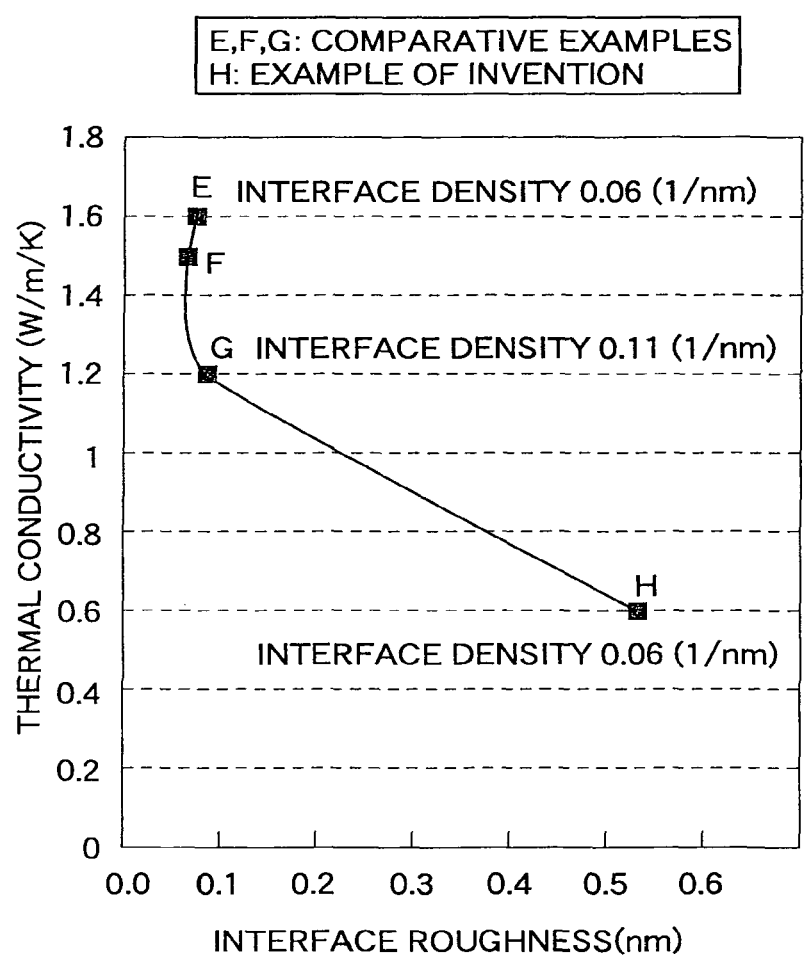

In each of the fourth to sixth comparative examples, the nanocomposite thermoelectric conversion material was produced according to the production process shown by the flowchart in FIG. 19. Propylene glycol monomethyl ether (PGM) slurry containing $SiO_2$ particles (average diameter: 5 nm), whose surfaces were not modified, was used, instead of PGM slurry containing $SiO_2$ particles whose surfaces are modified. In the fourth comparative example, the reducing agent was dropped at the dropping rate of 10 ml/minute, and a nanocomposite thermoelectric conversion material E was produced. In the fifth comparative example, the reducing agent was dropped at the dropping rate of 10 ml/minute, and a nanocomposite thermoelectric conversion material F was produced. In the sixth comparative example, the reducing agent was dropped at the dropping rate of 100 ml/minute, and a nanocomposite thermoelectric conversion material G was produced. The density of the $SiO_2$ interface in the produced nanocomposite thermoelectric conversion materials E and F was 0.06 (1/nm). The density of the $SiO_2$ interface in the produced nanocomposite thermoelectric conversion material G was 0.11 (1/nm). FIG. 20 shows the result of evaluation on the thermoelectric conversion characteristics of the produced nanocomposite thermoelectric conversion materials E to G.

Third Example

Figure 21:
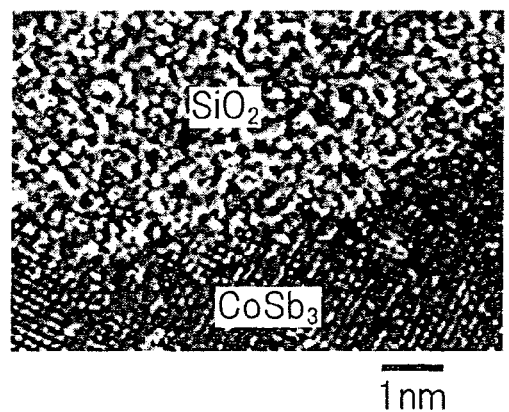

In a third example, a nanocomposite thermoelectric conversion material H was produced according to the production process shown by the flowchart in FIG. 19. Propylene glycol monomethyl ether (PGM) slurry containing $SiO_2$ particles (average diameter: 5 nm), whose surfaces were modified by a silane coupling agent, was used. The silane coupling agent was γ-aminopropyltrimethoxysilane, and the ratio of the silane coupling agent to $SiO_2$ was 1 mass %. The reducing agent was dropped at the dropping rate of 600 ml/minute. The interface density in the produced nanocomposite thermoelectric conversion material H was 0.06 (1/nm). FIG. 20 shows the thermal conductivity of the nanocomposite thermoelectric conversion material H produced in the third example, together with the thermal conductivities in the fourth to sixth comparative examples. FIG. 21 shows the TEM image of the nanocomposite thermoelectric conversion material H produced in the third example.

As shown in FIG. 20, in the nanocomposite thermoelectric conversion material produced using the dispersed material whose surface was modified by organic molecules according to the second production method, the interface roughness is particularly large, and the thermal conductivity is small.

Fourth Example

Figure 22:
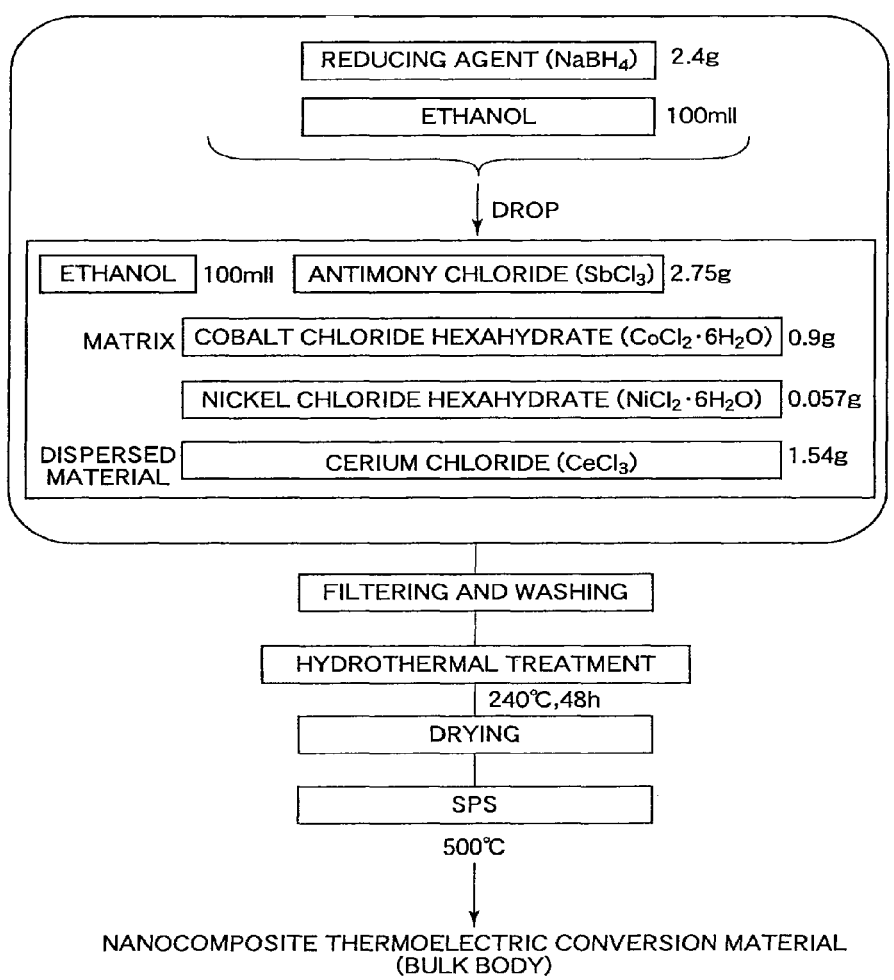

The nanocomposite thermoelectric conversion material was produced using the third production method according to the invention. In the nanocomposite thermoelectric conversion material, $CeO_2$ nanoparticles, which were particles of the dispersed material, were dispersed in the matrix (Co, Ni)$Sb_3$ of the thermoelectric conversion material. FIG. 22 shows a flowchart of the production process in the fourth example.

Preparation of the Source Material Solution

The source material solution was prepared by dissolving the following source materials in 100 ml of ethanol. The source material of the matrix included 2.75 g of antimony chloride ($SbCl_3$), 0.9 g of cobalt chloride hexahydrate ($CoCl_2 \cdot 6H_2O$), and 0.057 g of nickel chloride hexahydrate ($NiCl_2 \cdot 6H_2O$). The source material of the dispersed material was 1.54 g of cerium chloride ($CeCl_3$).

Reduction

The solution, which was produced by dissolving 2.4 g of $NaBH_4$ that was the reducing agent into 100 ml of ethanol, was dropped into the above-described source material solution.

Filtering and Washing

The ethanol slurry containing the nanoparticles precipitated by reduction was filtered and washed using the solution produced by mixing 500 ml of water with 300 ml of ethanol. Filtering and washing were further performed using 300 ml of ethanol.

Sintering

Spark plasma sintering (SPS), was performed on the collected powder at 500° C., and the nanocomposite thermoelectric conversion material was produced. In the nanocomposite thermoelectric conversion material, 30 volume % of $CeO_2$ particles, which were particles of the dispersed material, were dispersed in the matrix made of the thermoelectric conversion material (Co, Ni)$Sb_3$.

Observation of Constituent Phases

Figure 23A:
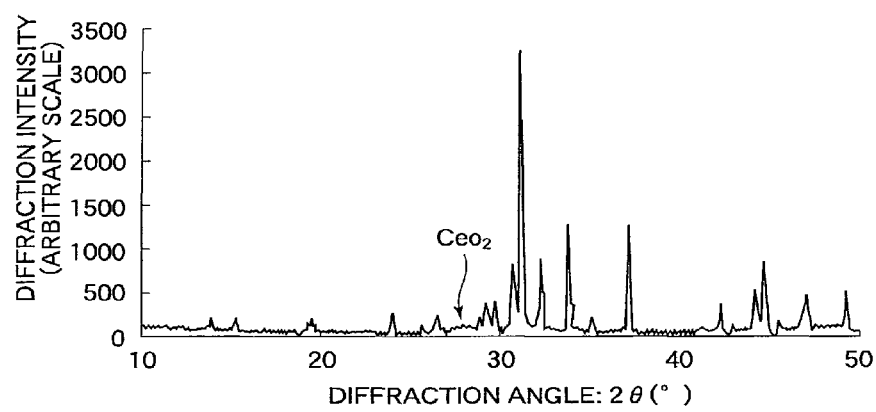
Figure 23B:
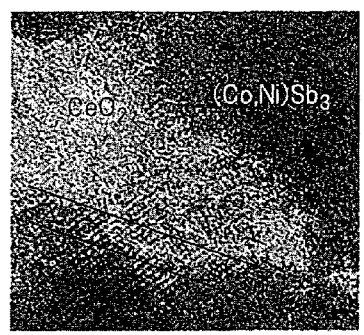

The produced powder was analyzed and observed by XRD analysis and TEM observation. FIG. 23A shows an XRD chart, and FIG. 23B shows a TEM image. As shown in the XRD chart, diffraction peaks of (Co, Ni)$Sb_3$ (all the peaks that are not marked) and a diffraction peak of $CeO_2$ were clearly observed. Thus, it was confirmed that the nanocomposite thermoelectric conversion material included both of the phase of (Co, Ni) $Sb_3$ and the phase of $CeO_2$. Also, it was confirmed that the interface roughness was 1.0±0.21 nm in the TEM image.

Performance

Table 1 shows structural features, that is, the average diameter of the particles, the interface density, and the interface roughness. Table 1 also shows measured values that are performance values, that is, the Seebeck coefficient, the specific resistance, the thermal conductivity, and the nondimensional performance index ZT at 400° C. Further, for the purpose of comparison, Table 1 shows values that are considered to be best values of a thermoelectric conversion material (Co, Ni) $Sb_3$ with a single phase, in which there is no dispersed material in a conventional example. The values are described in a publication (*1). It is evident from Table 1 that the thermal conductivity of the nanocomposite thermoelectric conversion material according to the invention is 0.7 (W/m/K) that is one-fifth of the thermal conductivity of the thermoelectric conversion material in the conventional example. Also, it is evident from Table 1 that the nondimensional performance index ZT of the nanocomposite thermoelectric conversion material according to the invention is 1.24 that is approximately 2.5 times as large as the nondimensional performance index ZT of the thermoelectric conversion material in the conventional example, and thus, the nondimensional performance index ZT of the nanocomposite thermoelectric conversion material according to the invention is significantly improved.

TABLE 1

| | Structural Features | | | Performance values (400° C.) | | | |
| --- | --- | --- | --- | --- | --- | --- | --- |
| | Average | | | | | | |
| Source Materials | particle diameter (nm) | Interface density (1/nm) | Interface roughness (nm) | Seebeck coefficient (µV/K) | Specific resistance (µΩm) | Thermal conductivity (W/m/K) | ZT |
| (Co, Ni)$Sb_3$/30 vol % $CeO_2$ | 31 | 0.06 | 1.0 ± 0.21 | −203 | 32 | 0.7 | 1.24 |
| Conventional example (*1) | — | — | — | −200 | 15 | 3.5 | 0.5 |

Heat Treatment

Then, the composite nanoparticles were placed in the hermetically-sealed autoclave device, and the matrix made of the alloy was produced by performing hydrothermal treatment at 240° C. for 48 hours.

Drying

Then, drying was performed in the $N_2$ gas flow atmosphere, and produced powder was collected. At this time, approximately 2.0 g of powder was collected.

The cited technology is described in the publication (*1) "Effect of NiSb on the thermoelectric properties of skutterudite $CoSb_3$", Journal of Applied Physics, volume 93, Issue 5, pp. 2758-2764 (2003). In the cited technology, an ingot was produced by sealing source materials (Co, Ni, Sb) in quartz, and heat-treating the source materials. Then, the ingot was crushed to produce powder. A bulk body was produced by performing sintering on the powder at 500 to 600° C. using a hot press.

Fifth Example

Figure 24:
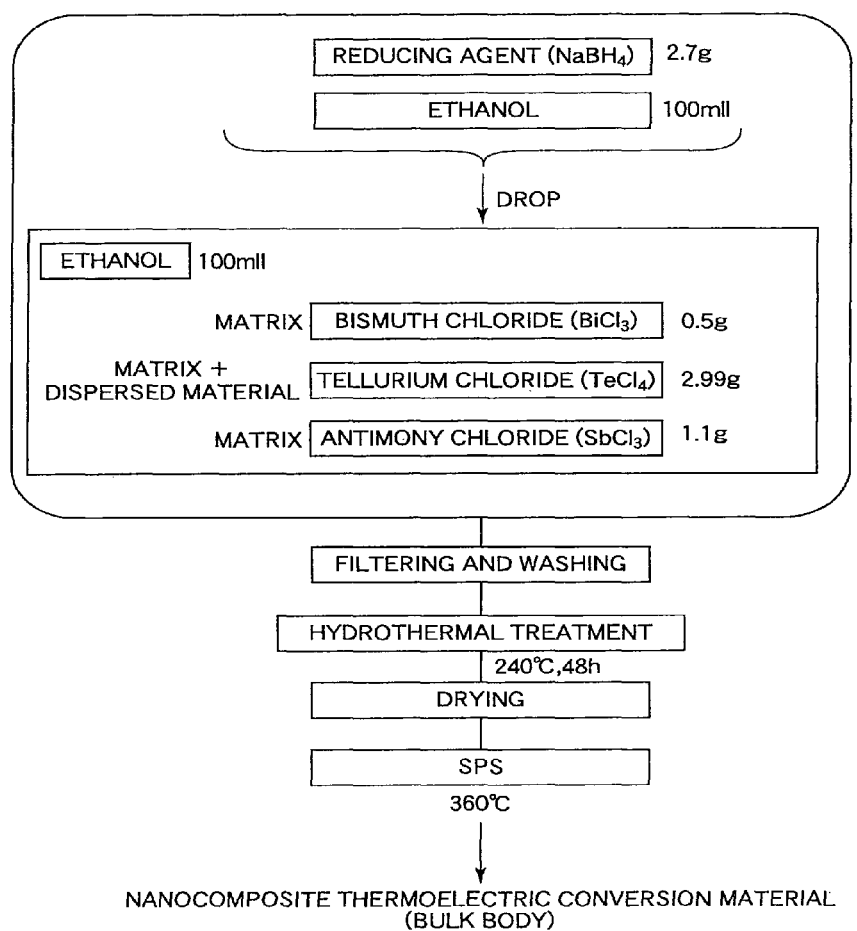

In a fifth example, the nanocomposite thermoelectric conversion material was produced using the fourth production method according to the invention. In the nanocomposite thermoelectric conversion material, Te nanoparticles, which were particles of the dispersed material, were dispersed in the matrix (Bi, Sb)$_2$Te$_3$ of the thermoelectric conversion material FIG. 24 shows a flowchart of the production process in the fifth example.

Preparation of the Source Material Solution

The source material solution was prepared by dissolving the following source materials in 100 ml of ethanol. The source materials of the matrix included 0.5 g 10 of bismuth chloride (BiCl$_3$) and 1.1 g of antimony chloride (SbCl$_3$). The source material of the matrix, which was also used as the source material of the dispersed material particles, was 2.99 g of tellurium chloride (TeCl$_4$). The amount of tellurium chloride (TeCl$_4$) was excessive with respect to a target composition ratio.

Reduction

The solution, which was produced by dissolving 2.7 g of NaBH$_4$ that was the reducing agent into 100 ml of ethanol, was dropped into the above-described source material solution. The ethanol slurry containing the nanoparticles precipitated by reduction was filtered and washed using the solvent produced by mixing 500 ml of water with 300 ml of ethanol. Then, filtering and washing were further performed using 300 ml of ethanol.

Heat Treatment

Then, the composite nanoparticles were placed in the hermetically-sealed autoclave device, and the matrix made of the alloy was produced by performing hydrothermal treatment at 240° C. for 48 hours. Then, drying was performed in the N$_2$ gas flow atmosphere, and the produced powder was collected. At this time, approximately 2.0 g of powder was collected.

Sintering

Spark plasma sintering (SPS) was performed on the collected powder at 360° C. Thus, the nanocomposite thermoelectric conversion material was produced. In the nanocomposite thermoelectric conversion material, 30 volume % of Te particles, which were particles of the dispersed material, were dispersed in the matrix made of the thermoelectric conversion material (Bi, Sb)$_2$Te$_3$.

By decreasing the amount of Te used when the source material solution was prepared, the nanocomposite thermoelectric conversion material, in which the final volume percentage of the dispersed material was 10 volume %, was also produced.

Observation of Constituent Phases

Figure 25A:
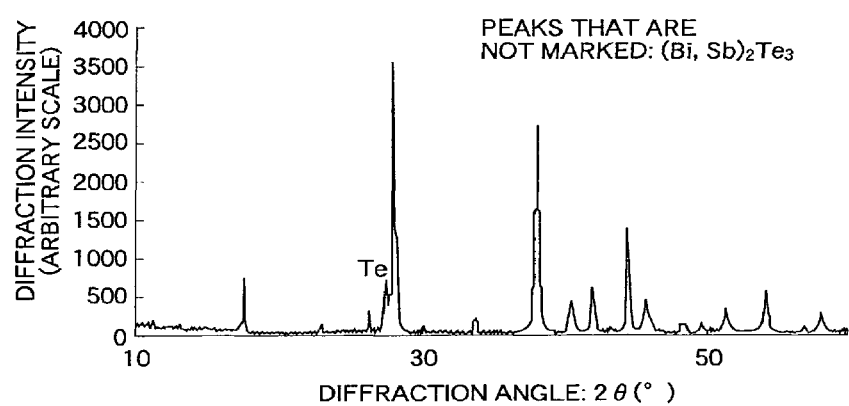
Figure 25B:
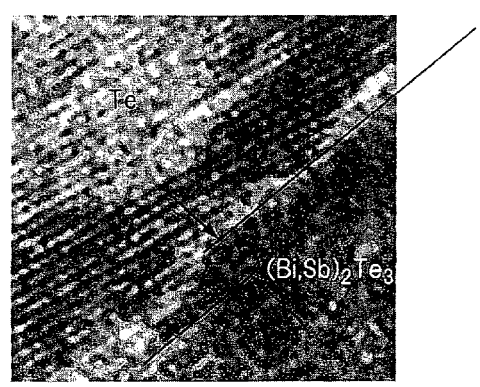

The produced powder was analyzed and observed by XRD analysis and TEM observation. FIG. 25A shows an XRD chart, and FIG. 25B shows a TEM image. As shown in the XRD chart, diffraction peaks of (Bi, Sb)$_2$Te$_3$ (all the peaks that are not marked) and a diffraction peak of Te were clearly observed. Thus, it was confirmed that the nanocomposite thermoelectric conversion material included both of the phase of (Bi, Sb)$_2$Te$_3$ and the phase of Te. Also, it was confirmed that the interface roughness was 1.5±0.22 nm in the TEM image.

Performance

Table 2 shows structural features, that is, the average diameter of the particles, the interface density, and the interface roughness. Table 2 also shows measured values that are performance values, that is, the Seebeck coefficient, the specific resistance, the thermal conductivity, and the nondimensional performance index ZT at room temperature. Further, for the purpose of comparison, Table 2 shows values that are considered to be best values of a thermoelectric conversion material (Bi, Sb)$_2$Te$_3$ with a single phase, in which there is no dispersed material in a conventional example. The values are described in a publication (*2). It is evident from Table 2 that the thermal conductivity of the nanocomposite thermoelectric conversion material according to the invention is approximately two-fifths (10 volume % of Te) to approximately one-fourth (30 volume % of Te) of the thermal conductivity of the thermoelectric conversion material in the conventional example. Also, it is evident from Table 2 that the nondimensional performance index ZT of the nanocomposite thermoelectric conversion material according to the invention is increased by approximately 10% (10 volume % of Te) to approximately 40% (30 volume % of Te), as compared to the nondimensional performance index ZT of the thermoelectric conversion material in the conventional example, and thus, the nondimensional performance index ZT of the nanocomposite thermoelectric conversion material according to the invention is significantly improved.

TABLE 2

| | Structural Features | | | Performance values (room temperature) | | | |
|---|---|---|---|---|---|---|---|
| Source Materials | Average particle diameter (nm) | Interface density (1/nm) | Interface roughness (nm) | Seebeck coefficient (μV/K) | Specific resistance (μΩm) | Thermal conductivity (W/m/K) | ZT |
| (Bi, Sb)Sb$_2$/30 vol % Te | 32 | 0.06 | 1.5 ± 0.22 | 203 | 24 | 0.45 | 1.15 |
| (Bi, Sb)Sb$_2$/10 vol % Te | 52 | 0.01 | | 205 | 20 | 0.7 | 0.9 |
| Conventional example (*2) | — | — | — | 205 | 8.9 | 1.75 | 0.81 |

The cited technology is described on page 227 in the publication (*2) 10 "CRC Handbook of Thermoelectrics". In the cited technology, a so-called "Traveling Heater Method" was employed. In the method, a source material ingot is placed in an ampule (quartz). While the ampule passes through a heater (580° C.), the source material is melted. After the ampule is taken out from the heater, the source material is cooled and solidified. At this time, a single crystal of the source material is produced.

Figure 26:
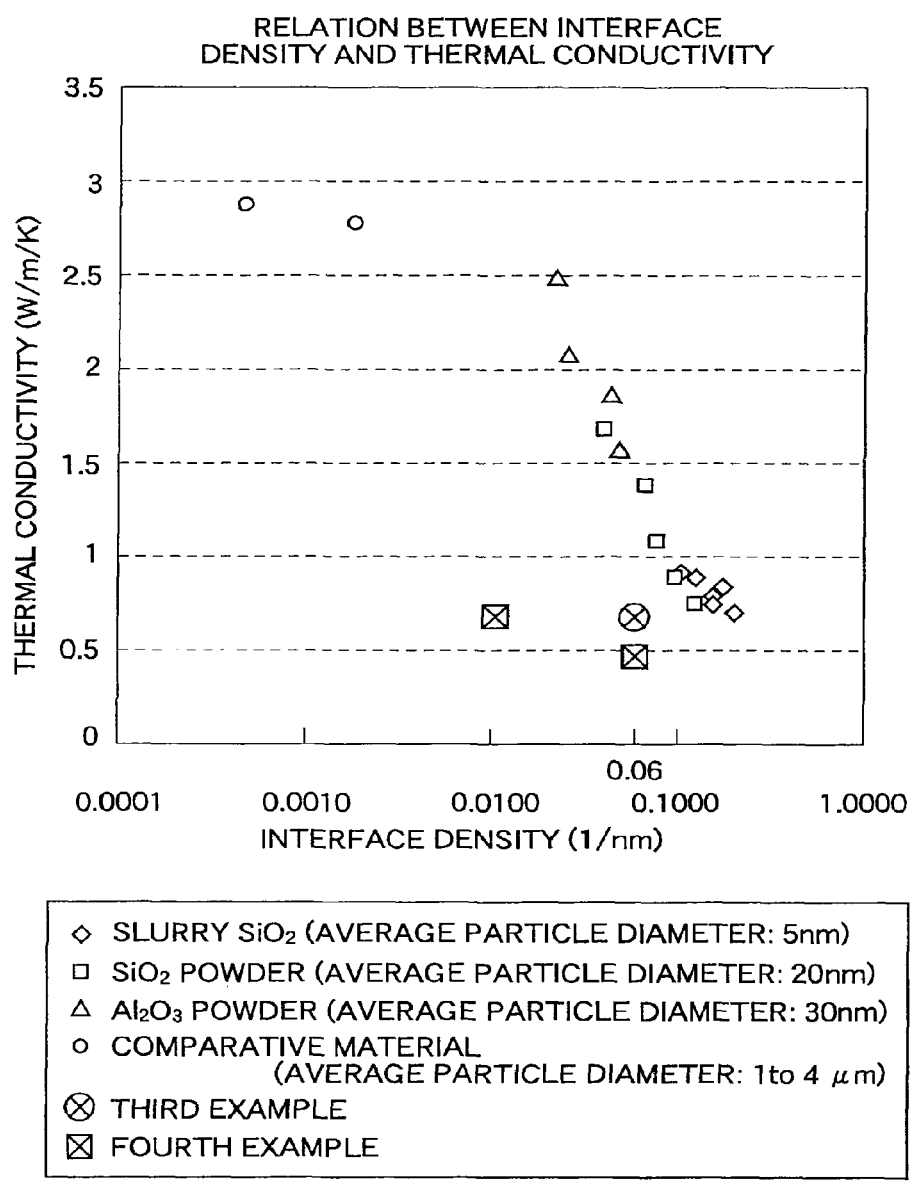

In FIG. 26, the thermal conductivity of each of the thermoelectric conversion materials in the third and fourth examples and conventional thermoelectric conversion materials is plotted with respect to the interface density. When the thermal conductivities at the same interface density are compared with each other, it is evident that that the thermal conductivities of the nanocomposite thermoelectric conversion materials in the third and fourth examples are decreased to a large extent as compared to the conventional thermoelectric conversion materials.

The conventional materials and the comparative material shown in FIG. 26 will be described in detail. The conventional material indicated by a rhombus mark in FIG. 26 was produced using 3.35 g of slurry $SiO_2$ (the average diameter of the particles: 5 nm). Propylene glycol monomethyl ether (PGM) slurry (*) containing $SiO_2$ that was the dispersed material was dispersed in ethanol slurry in which salts of Co, Ni, and Sb were dissolved, as in the fourth example. The composite particles of $CoNiSbSiO_2$ were produced by reducing the salts using the reducing agent that was the same as the reducing agent used in the fourth example. Then, a bulk body was produced by performing hydrothermal treatment and sintering. The PGM slurry (*) was produced by dispersing 3.35 g (10 weight %) of $SiO_2$ (the diameter of the particles: 5 nm) in propylene glycol monomethyl ether (PGM) solvent. The other conventional materials and the comparative material shown in FIG. 26 were also produced according to a method similar to the above-described method, except that dispersed materials, such as $SiO_2$ powder and $Al_2O_3$ powder, were used in the following manner.

The conventional material indicated by a square mark in FIG. 26 was produced using 0.335 g of $SiO_2$ powder (the average diameter of the particles: 20 nm).

The conventional material indicated by a triangle mark in FIG. 26 was produced using 0.384 g of $Al_2O_3$ powder (the average diameter of the particles: 30 nm).

The comparative material indicated by a circle mark in FIG. 26 was produced using 0.335 g of $SiO_2$ particles (the average diameter of the particles: 1 to 4 μm).

Figure 27:
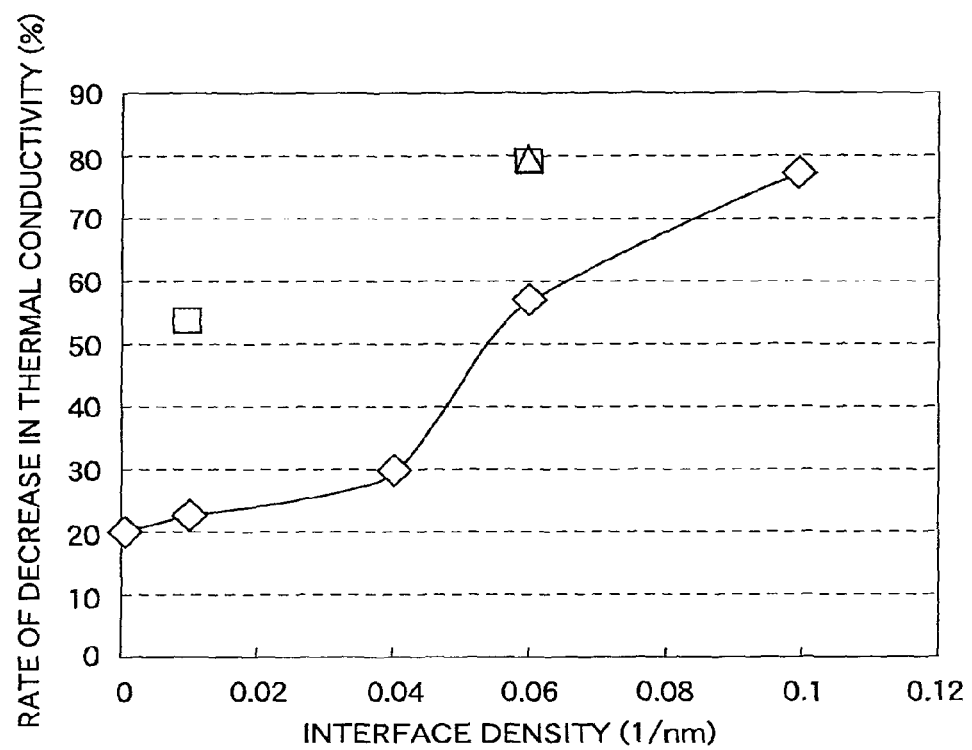

FIG. 27 shows the rate of decrease in the thermal conductivity of each of the comparative example (*4) (indicated by a rhombus mark), the third example (indicated by a triangle mark), and the fourth example (indicated by a square mark), with respect to the thermal conductivity of the conventional example (*3). It is evident from FIG. 27 that the thermal conductivity is decreased to a large extent by making the interface roughness large according to the invention. The conventional example (*3) is the same as the conventional example described in Table 1. The comparative example (*4) is the same as the comparative material in FIG. 26.

The invention is not restricted to the illustrative examples described above. The examples are not intended as limitations on the scope of the invention. Methods, apparatus, compositions and the like described herein are exemplary and not intended as limitations on the scope of the invention. Changes therein and other uses will occur to those skilled in the art. The scope of the invention is defined by the scope of the claims.

We claim:

1. A process for manufacturing a nanocomposite thermoelectric material having a plurality of nanoparticles within a matrix of the nanocomposite thermoelectric material and a desired figure of merit, the process comprising:
   providing a conductive bulk material and an insulating nanoparticle material, the insulating nanoparticle material comprising a surface roughness value within a range of interfacial density values between 0.02 and 3.0 nanometers$^{-1}$; and
   manufacturing the nanocomposite thermoelectric material from the conductive bulk material and insulating nanoparticle material, the nanocomposite thermoelectric material having a plurality of insulating nanoparticles within the conductive bulk material matrix with a density of the interface between conductive bulk matrix and the insulating nanoparticles between 0.02 to 3.0 nanometers$^{-1}$.

2. The process of claim 1, wherein the surface roughness value of the insulating nanoparticle material is obtained by in-situ nanoparticles growth.

3. The process of claim 1, wherein the density of the interface between conductive bulk matrix and the insulating nanoparticles is between 0.06 to 1.8 nanometers$^{-1}$.

4. The process of claim 1, wherein the density of the interface between conductive bulk matrix and the insulating nanoparticles is between 0.1 to 1.8 nanometers$^{-1}$.

* * * * *